(12) United States Patent
Hatcher et al.

(10) Patent No.: US 9,614,002 B1
(45) Date of Patent: Apr. 4, 2017

(54) 0T BI-DIRECTIONAL MEMORY CELL

(71) Applicant: Samsung Electronics Co., Ltd., Suwon-si, Gyeonggi-do (KR)

(72) Inventors: Ryan M. Hatcher, Austin, TX (US); Titash Rakshit, Austin, TX (US); Borna J. Obradovic, Leander, TX (US); Jorge Kittl, Round Rock, TX (US); Joon Goo Hong, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/238,720

(22) Filed: Aug. 16, 2016

Related U.S. Application Data

(60) Provisional application No. 62/281,626, filed on Jan. 21, 2016.

(51) Int. Cl.
*G11C 11/16* (2006.01)
*H01L 27/22* (2006.01)

(52) U.S. Cl.
CPC ............ *H01L 27/224* (2013.01); *G11C 11/16* (2013.01); *G11C 11/161* (2013.01); *G11C 11/1673* (2013.01); *G11C 11/1675* (2013.01)

(58) Field of Classification Search
CPC ............................. G11C 11/16; G11C 13/0069
USPC .................................................. 365/158, 173
See application file for complete search history.

(56) References Cited

U.S. PATENT DOCUMENTS

| 6,778,421 | B2* | 8/2004 | Tran | G11C 11/16 365/100 |
| 7,192,787 | B2* | 3/2007 | DeBrosse | H01L 27/222 257/295 |
| 7,203,129 | B2* | 4/2007 | Lin | G11C 11/16 365/171 |
| 7,382,664 | B2* | 6/2008 | Le Phan | G11C 7/22 365/158 |
| 7,869,265 | B2* | 1/2011 | Shimizu | G11C 11/16 365/130 |
| 7,876,626 | B2* | 1/2011 | Mukai | G11C 7/18 365/189.07 |
| 7,936,580 | B2* | 5/2011 | Chen | G11C 11/16 365/158 |
| 8,071,969 | B2* | 12/2011 | Aoyama | H01L 27/24 257/2 |
| 8,351,240 | B2* | 1/2013 | Park | G11C 11/5678 365/113 |
| 8,482,972 | B2* | 7/2013 | Chung | G11C 11/1659 365/148 |

(Continued)

*Primary Examiner* — Michael Tran
(74) *Attorney, Agent, or Firm* — Renaissance IP Law Group LLP

(57) ABSTRACT

A bidirectional memory cell includes a write unit and a read unit. The write unit and the read unit each include an MTJ structure having a first and second pinned layers and a free layer. The first and second pinned layers are separated from the free layer by at least one tunnel barrier. The first pinned layer is electrically coupled to a first write line through a first diode. The second pinned layer is electrically connected to a second word line through a second diode. The free layer is electrically coupled to a first bit line. Additionally, the free layer of the read unit is magnetically coupled to the free layer of the write unit.

20 Claims, 16 Drawing Sheets

(56) References Cited

U.S. PATENT DOCUMENTS

| | | | |
|---|---|---|---|
| 8,638,590 B2 * | 1/2014 | Hao | G11C 11/16 |
| | | | 365/148 |
| 8,767,435 B1 * | 7/2014 | Mani | G11C 17/02 |
| | | | 365/96 |
| 8,952,470 B2 * | 2/2015 | Lupino | H01L 27/224 |
| | | | 257/421 |
| 9,269,429 B2 * | 2/2016 | Park | G11C 13/0069 |

* cited by examiner

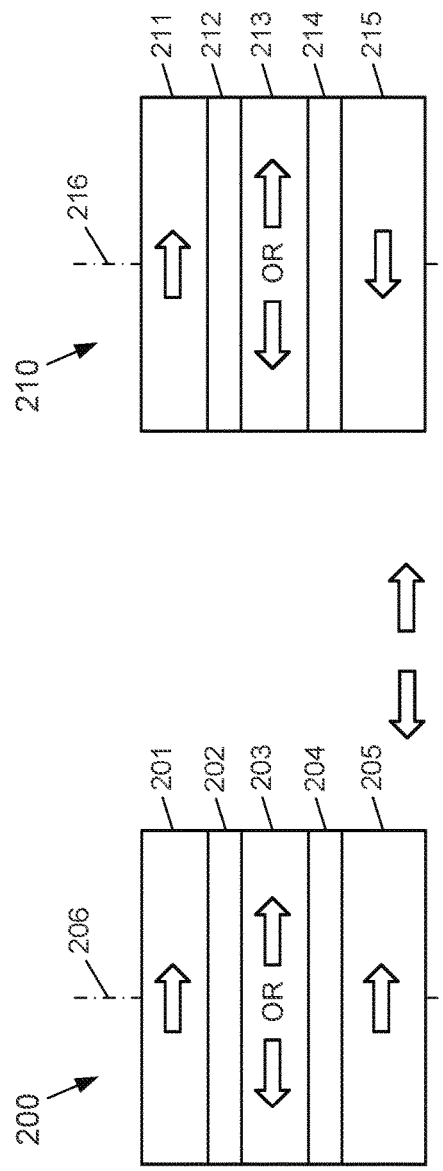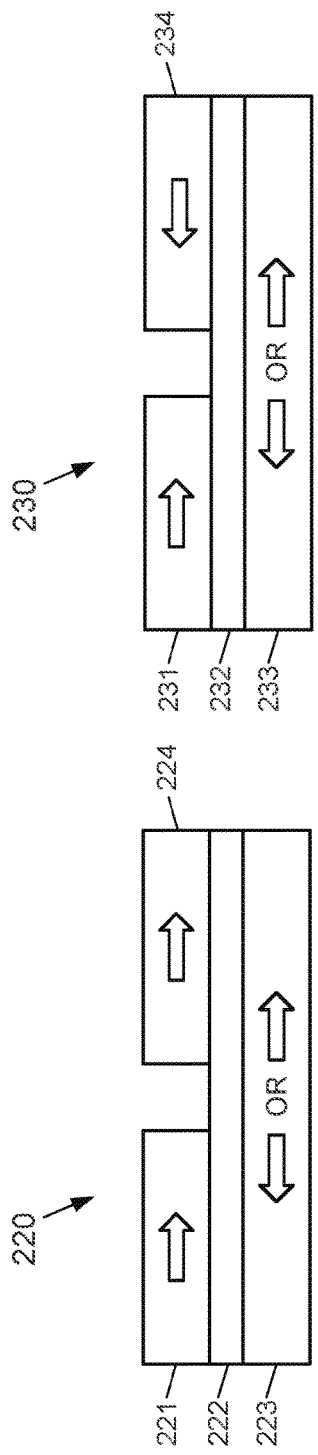

VIEW A-A'

0T BI-DIRECTIONAL MEMORY CELL

CROSS-REFERENCE TO RELATED APPLICATION

This patent application claims the priority benefit under 35 U.S.C. § 119(e) of U.S. Provisional Patent Application No. 62/281,626, filed on Jan. 21, 2016, the disclosure of which is incorporated herein by reference in its entirety.

BACKGROUND

Bidirectional memories are memory devices that use bidirectional voltages and/or currents in order to read and/or write the state of the memory device. Bidirectional memories range from non-volatile storage devices to processor cache memory. For example, the state written to a Spin Torque Transfer (STT) magnetic memory device depends on the direction of the current flowing through the device.

Conventional bidirectional memories include at least one selector transistor per memory cell. Typically, conventional bidirectional memories include two selector transistors per memory element. Although conventional bidirectional memories may be stacked within multiple levels above the selector transistors, which are located on the die beneath the bidirectional memory, the density of such conventional bidirectional memories is limited by the area that is required for the selector transistors. That is, the sizes and the number of the selector transistors place a limit on how dense a conventional bidirectional memory may be made.

SUMMARY

An example embodiment provides a bidirectional memory unit that may include a free magnetic layer electrically coupled to a bit line; a first pinned magnetic layer and a second pinned magnetic layer separated from the free magnetic layer by at least one tunnel barrier layer; a first diode including an anode and a cathode in which the anode of the first diode may be coupled to a first word line and the cathode of the first diode may be electrically coupled to the first pinned magnetic layer; and a second diode including an anode and a cathode in which the anode of the second diode may be electrically coupled to the second pinned magnetic layer and the cathode of the second diode may be electrically coupled to a second word line. The memory unit may be a write unit or a read unit. In one embodiment, the bidirectional memory unit may be a radially arranged memory unit, and the first pinned magnetic layer and the second pinned magnetic layer may be separated from the free magnetic layer by a single tunnel barrier layer. In one embodiment, the first pinned magnetic layer and the second pinned magnetic layer may be on a same side of the single tunnel barrier layer from the free magnetic layer. In one embodiment, the bidirectional memory unit may be an axially arranged memory unit, and the first pinned magnetic layer may be separated from the free magnetic layer by a first tunnel barrier layer and the second pinned magnetic layer may be separated from the free magnetic layer by a second tunnel barrier layer. In one embodiment, the first pinned magnetic layer and the second pinned magnetic layer may be on opposite sides of the free magnetic layer. In another embodiment in which the memory unit may be a read unit, a state of the free magnetic layer may be detected by sensing a voltage at the free magnetic layer if the first and second diodes are forward biased.

An example embodiment provides a bidirectional memory cell that may include a write unit and a read unit. The write unit may include a first free magnetic layer electrically coupled to a first bit line; a first pinned magnetic layer and a second pinned magnetic layer separated from the first free magnetic layer by at least one write-unit tunnel barrier layer; a first diode including an anode and a cathode in which the anode of the first diode may be coupled to a first word line and the cathode of the first diode may be electrically coupled to the first pinned magnetic layer; and a second diode including an anode and a cathode in which the anode of the second diode may be electrically coupled to the second pinned magnetic layer and the cathode of the second diode may be electrically coupled to a second word line. The read unit may include a second free magnetic layer electrically coupled to a second bit line and magnetically coupled to the first free magnetic layer of the write unit; a third pinned magnetic layer and a fourth pinned magnetic layer separated from the second free magnetic layer by at least one read-unit tunnel barrier layer; a third diode including an anode and a cathode in which the anode of the third diode may be coupled to a third word line and the cathode of the third diode may be electrically coupled to the third pinned magnetic layer; and a fourth diode including an anode and a cathode in which the anode of the fourth diode may be electrically coupled to the fourth pinned magnetic layer and the cathode of the second diode may be electrically coupled to a fourth word line.

An example embodiment provides a bidirectional memory cell that may include a write unit and a read unit. The write unit may include a first magnetic tunnel junction (MTJ) structure including a first pinned magnetic layer, a first free magnetic layer and a second pinned magnetic layer in which the first and second pinned magnetic layers may be separated from the first free magnetic layer by at least one write-unit tunnel barrier layer. The first pinned magnetic layer may be electrically coupled to a first write line through a first diode that includes an anode and cathode in which the anode of the first diode may be electrically connected to the first word line and the cathode of the first diode may be electrically connected to the first pinned magnetic layer. The second pinned magnetic layer may be electrically connected to a second word line through a second diode that may include an anode and a cathode in which the anode of the second diode may be electrically connected to the second pinned magnetic layer and the cathode of the second diode may be electrically connected to the second word line. The first free magnetic layer may be electrically coupled to a first bit line. The read unit may include a second MTJ structure that may include a third pinned magnetic layer, a second free magnetic layer and a fourth pinned magnetic layer in which the third and fourth pinned magnetic layers may be separated from the second free magnetic layer by at least one read-unit tunnel barrier layer. The third pinned magnetic layer may be electrically coupled to a third write line through a third diode that may include an anode and cathode in which the anode of the third diode may be electrically connected to the third word line and the cathode of the third diode may be electrically connected to the third pinned magnetic layer. The fourth pinned magnetic layer may be electrically connected to a fourth word line through a fourth diode that may include an anode and a cathode in which the anode of the fourth diode may be electrically connected to the fourth pinned magnetic layer and the cathode of the fourth diode may be electrically connected to the fourth word line. The second free magnetic layer may be electrically coupled to a second bit line and may be magnetically coupled to the first free magnetic layer.

BRIEF DESCRIPTION OF THE DRAWINGS

In the following section, the aspects of the subject matter disclosed herein will be described with reference to exemplary embodiments illustrated in the figures, in which:

FIG. 2A depicts a cross-sectional view of an embodiment of an axially arranged write unit according to the subject matter disclosed herein;

FIG. 2B depicts a cross-sectional view of an embodiment of an axially arranged read unit according to the subject matter disclosed herein;

FIG. 2C depicts a cross-sectional view of an embodiment of a radially arranged write unit according to the subject matter disclosed herein;

FIG. 2D depicts a cross-sectional view of an embodiment of a radially arranged read unit according to the subject matter disclosed herein;

DETAILED DESCRIPTION

Figure 1A:
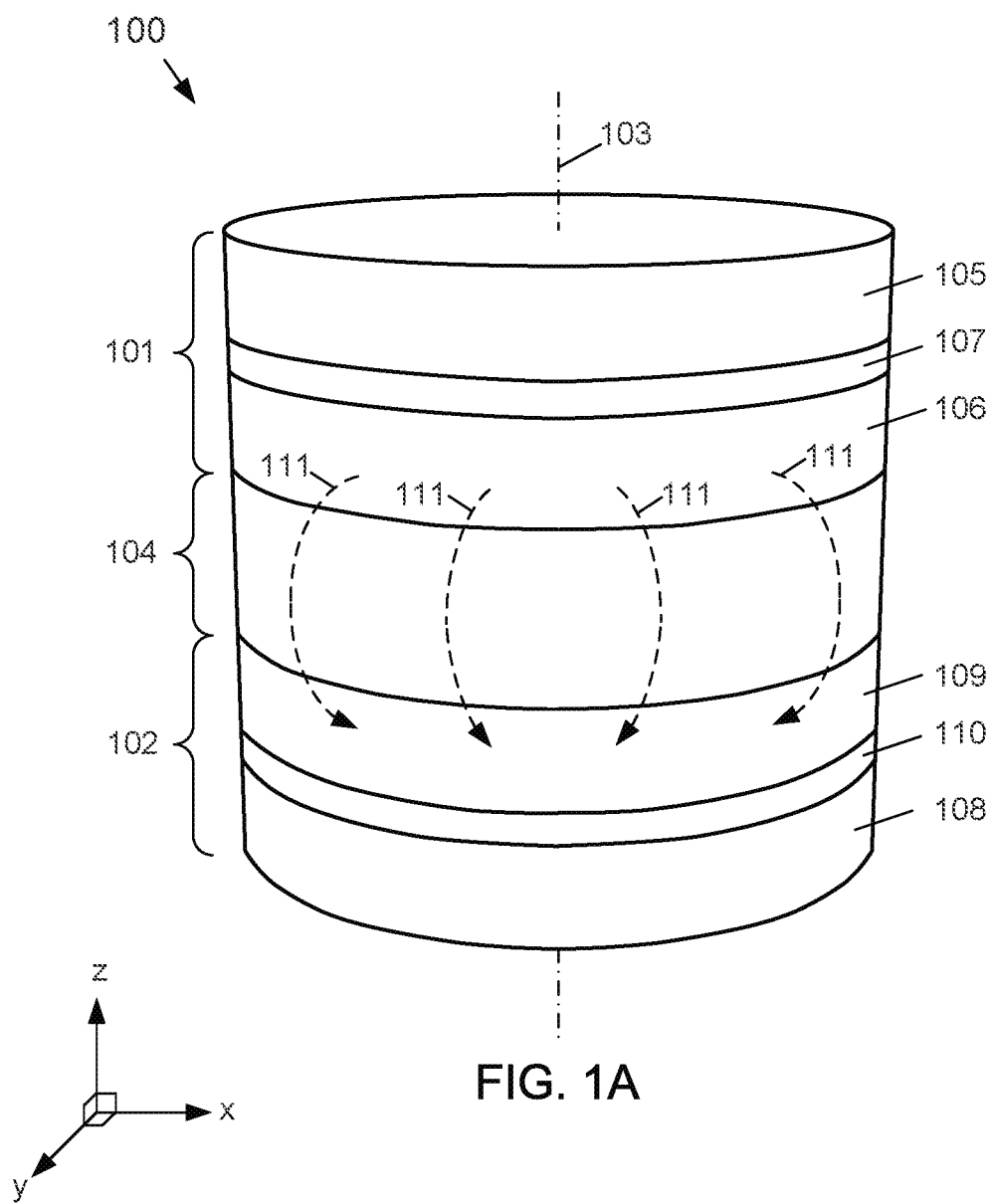
FIG. 1A depicts a perspective view of an embodiment of an axially arranged bidirectional memory cell according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The example embodiments described herein may be described in the context of particular magnetic junctions and magnetic memories having certain components, arrangements and/or configurations. It should be understood that the subject matter disclosed herein is consistent with the use of magnetic junctions and magnetic memories having other and/or additional components and/or other features that are not inconsistent with the subject matter disclosed herein. Aspects of the subject matter disclosed herein are disclosed in the context of current understanding of the spin-transfer phenomenon, of magnetic anisotropy, and/or of other physical phenomenon. Consequently, it should be understood that any theoretical explanations of behavior of the disclosed subject matter are made based upon this current understanding of spin transfer, magnetic anisotropy and/or other physical phenomenon. The disclosed subject matter, however, is not dependent upon a particular physical explanation. It should also be understood that the disclosed subject matter is described in the context of a structure having a particular arrangement and/or configuration. It should be understood that the method and system may be consistent with other structures. Additionally, the disclosed method and system are described in the context of certain layers being simple, multilayer and/or synthetic. It should be understood, however, that the layers may have another structure. Furthermore, the subject matter disclosed herein may be described in the context of magnetic junctions and/or substructures having particular layers. It should be understood that magnetic junctions and/or substructures having additional and/or different layers that are not inconsistent with the disclosed subject matter could also be used. Moreover, certain components may be described as being magnetic, ferromagnetic and ferrimagnetic. As used herein the term "magnetic" or "ferromagnetic" includes, but is not limited to ferromagnets and ferrimagnets. The subject matter disclosed herein may also be disclosed in the context of single magnetic junctions and substructures. It should be understood that the disclosed subject matter is consistent with the use of magnetic memories having multiple magnetic junctions and using multiple substructures. Further, as used herein, the terms "in-plane" or "horizontal" in connection with a magnetization direction means that the magnetization direction is substantially within or substantially parallel to the plane of one or more of the layers of a magnetic junction. Conversely, the terms "perpendicular" or "vertical" in connection with a magnetization direction means that the magnetization direction is substantially perpendicular to one or more of the layers of the magnetic junction.

The subject matter disclosed herein provides a bidirectional memory technology that does not use any selector transistors per memory element. Instead, the subject matter disclosed herein provides a bidirectional memory that utilizes transistors that drive the edge of crossbar networks (i.e., the word lines and bit lines), thereby increasing the memory density because selector transistors that are associated with each memory cell have been eliminated. In particular, the subject matter disclosed herein eliminates the need for a front end of line (FEOL) transistor for memory cells of a back end of line (BEOL) bidirectional memory (e.g., STT MRAM). Thus, large stackable memory arrays can be implemented in the BEOL without being constrained by needing one or more on die transistors per memory cell of the BEOL bidirectional memory.

In one embodiment, a bidirectional memory includes diodes associated with a memory cell to enable different polarities of potential and/or current to be applied across a memory cell without using selector transistors. In one embodiment, a bidirectional memory cell includes a read unit and a write unit, each of which has a magnetic tunnel junction (MTJ) that stores the state of the unit. The MTJ of the read unit is magnetically coupled to the MTJ of the write unit by exchange, or dipolar, coupling. The architectural arrangement disclosed herein allows the properties of each of the MTJs to be tailored to their respective function (either for reading or for writing). Additionally, the architectural arrangement disclosed herein provides that read operations are electrically isolated from write operations, thereby reducing read-disturb errors. Moreover, the MTJ of the read unit may be configured so that the state may be read by sensing the potential on the free magnetic layer of the MTJ, which provides a practical advantage over sensing a direction (or magnitude) of resistance because directly sensing a differential potential is significantly less sensitive to variation than directly sensing resistance directly.

One embodiment provides a structure that enables both read and write operations on a bidirectional memory that uses diodes associated with each memory cell instead of selector transistors. In one embodiment, the rows within an array of memory elements correspond to words and the columns correspond to bits. During a read or a write operation, one word row is enabled based on the polarity of one or more word lines that are connected to the memory cells in that given word row. All the other word lines are disabled by setting the opposite polarity on their corresponding word lines. The diodes associated with each memory cell are operative so that the memory elements in a selected word row are enabled for either a read or a write operation because a subset of the diodes of the memory cells connected to the word lines are forward biased, whereas the diodes of the unselected memory cells are reverse biased. If the polarity of the word lines reverse biases the diodes of a memory cell, the corresponding memory cells are not enabled for writing or reading.

FIG. 1A depicts a perspective view of an embodiment of an axially arranged bidirectional memory cell 100 according to the subject matter disclosed herein. The bidirectional memory cell 100 includes a write unit 101 and a read unit 102. The write unit 101 is axially separated from the read unit 102 along axis 103 (i.e., in the z-axis direction) by a separator 104. In one embodiment, the separator 104 may be formed from a nonconductive dielectric material. The write unit 101 may include an MTJ that may be formed by a pinned magnetic pattern 105, a free magnetic pattern 106 and a tunnel barrier pattern 107 between the pinned magnetic pattern 105 and the free magnetic pattern 106.

The read unit 102 may include an MTJ that is formed by a pinned magnetic pattern 108, a free magnetic pattern 109 and a tunnel barrier pattern between the pinned magnetic pattern 108 and the free magnetic pattern 109. The free pattern 109 of the read unit 102 is exchange, or dipolar, magnetically coupled to the free magnetic pattern 106 of the write unit 101, as indicated at the dashed arrows 111. That is, through exchange coupling, the free magnetic pattern 109 of the read unit 102 has the same state, or magnetic polarization direction, as the free magnetic pattern 106 of the write unit 101.

The MTJs of the write unit 101 and of the read unit 102 may have an easy axis of magnetization that is either in plane (i.e., parallel to or substantially parallel to a plane formed by the x- and y-axes) or perpendicular to the horizontal surfaces of the MTJ (i.e., parallel or substantially parallel to the z-axis).

Figure 1B:
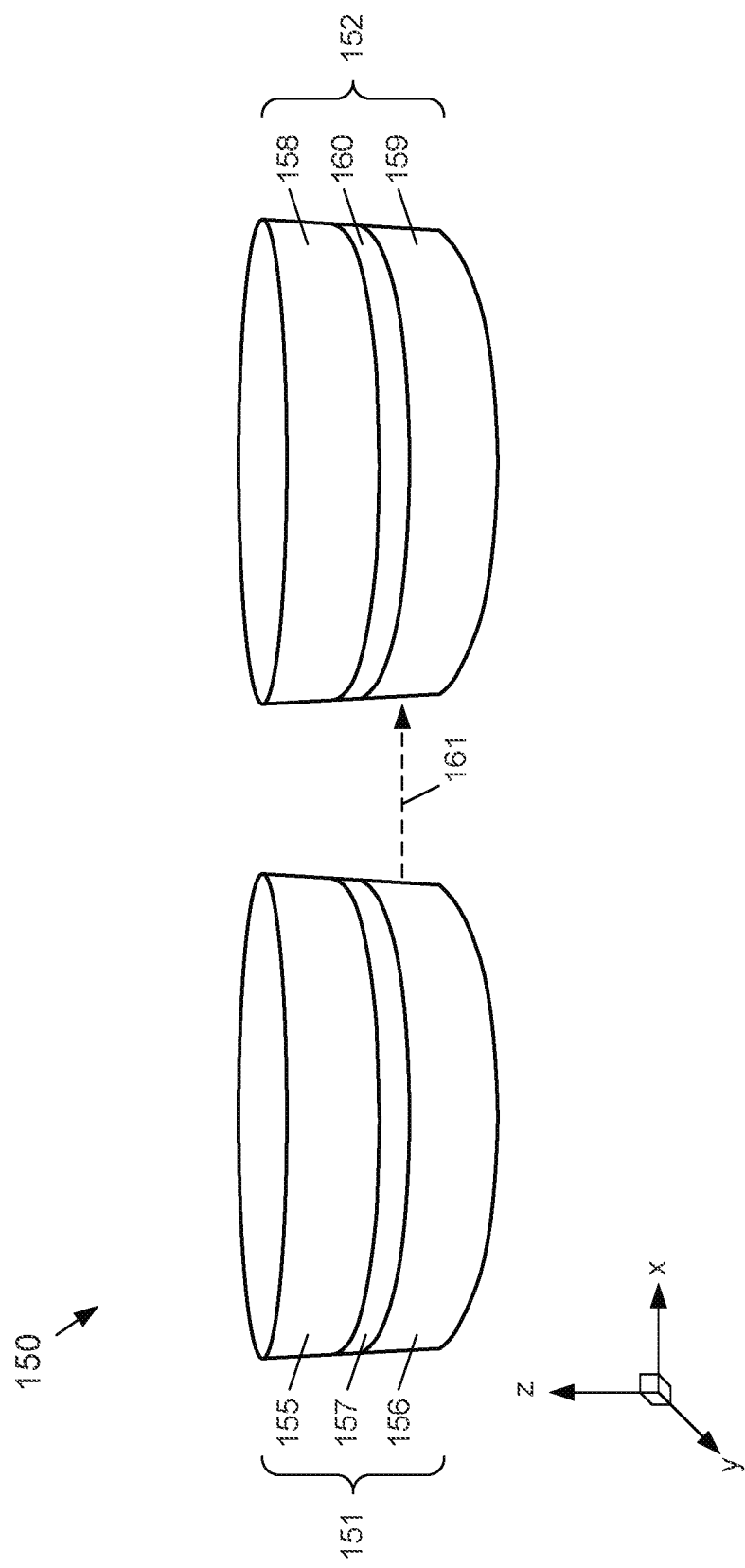
FIG. 1B depicts a perspective view of an embodiment of a radially arranged bidirectional memory cell according to the subject matter disclosed herein.

FIG. 1B depicts a perspective view of an embodiment of a radially arranged bidirectional memory cell 150 according to the subject matter disclosed herein. The bidirectional memory cell 150 includes a write unit 151 and a read unit 152. The write unit 151 is radially separated from the read unit 152. That is, the write unit 151 is separated from the read unit 152 in a direction that is substantially parallel to a plane formed by the x- and y-axes. The write unit 151 may include an MTJ that is formed by a pinned magnetic pattern 155, a free magnetic pattern 156 and a tunnel barrier pattern 157 between the pinned magnetic pattern 155 and the free magnetic pattern 156.

The read unit 152 may include an MTJ that is formed by a pinned magnetic pattern 158, a free magnetic pattern 159 and a tunnel barrier pattern 160 between the pinned magnetic pattern 158 and the free magnetic pattern 159. The free magnetic pattern 159 of the read unit 152 is exchange, or dipolar, magnetically coupled to the free magnetic pattern 156 of the write unit 151, as indicated by the dashed arrow at 161. That is, through exchange coupling, the free magnetic pattern 159 of the read unit 152 has the same state, or magnetic polarization direction, as the free magnetic pattern 156 of the write unit 151.

The MTJs of the write unit 151 and of the read unit 152 may have an easy axis of magnetization that is either in plane (i.e., parallel to or substantially parallel to a plane formed by the x- and y-axes) or perpendicular to the horizontal surfaces of the MTJ (i.e., parallel or substantially parallel to the z-axis).

FIG. 2A depicts a cross-sectional view of an embodiment of an axially arranged write unit 200 according to the subject matter disclosed herein. The write unit 200 may include an MTJ that is formed by a first pinned magnetic pattern 201, a first tunnel barrier pattern 202, a free magnetic pattern 203, a second tunnel barrier pattern 204, and a second pinned magnetic pattern 205. The first tunnel barrier pattern 202 separates the first pinned magnetic pattern 201 from the free magnetic pattern 203, and the second tunnel barrier pattern 203 separates the second pinned magnetic pattern 205 from the free magnetic pattern 203. The first pinned magnetic pattern 201 is electrically isolated from the second pinned magnetic pattern 205 except through the first and second tunnel barrier patterns 202 and 204, and the free magnetic pattern 203. For the axially arranged write unit 200, the first pinned magnetic pattern 201 is arranged to be on the opposite side of the free magnetic pattern 203 from the second pinned magnetic pattern 205. That is, the first pinned magnetic pattern 201 is arranged to be axially separated along axis 206 from the second pinned magnetic pattern 205. As indicated by the arrows within the magnetic layers of the write unit 200, the direction of the magnetization of the first pinned magnetic pattern 201 is parallel to the direction of magnetization of the second pinned magnetic pattern 205 (i.e., in the same direction). The direction of magnetization of the free magnetic pattern 203 may be controlled in a well-known manner to be parallel or anti-parallel to the magnetization directions of the first and second pinned magnetic patterns 201 and 205.

Although it is indicated in FIG. 2A that the direction of magnetization of the first and second pinned patterns 201 and 205 is toward the right, it should be understood that the direction of the magnetization of the first and second pinned patterns 201 and 205 could alternatively be toward the left. In this regard, it should be understood that the direction of magnetization of the various pinned magnetic patterns and free magnetic patterns, as depicted in the figures herein, may alternatively be in a direction that is opposite to the direction indicated. Additionally, although write units and the read units depicted in the figures herein indicate the magnetization directions of the various pinned magnetic patterns and the free magnetic patterns as being horizontal by horizontally oriented arrows within the layers, it should be understood that the magnetic layers of the write units and the read units disclosed herein may alternatively have a perpendicular magnetization direction.

FIG. 2B depicts a cross-sectional view of an embodiment of an axially arranged read unit 210 according to the subject matter disclosed herein. The read unit 210 may include a first pinned magnetic pattern 211, a first tunnel barrier pattern 212, a free magnetic pattern 213, a second tunnel barrier pattern 214, and a second pinned magnetic pattern 215. The first tunnel barrier pattern 212 separates the first pinned magnetic pattern 211 from the free magnetic pattern 213, and the second tunnel barrier pattern 213 separates the second pinned magnetic pattern 215 from the free magnetic pattern 213. The first pinned magnetic pattern 211 is electrically isolated from the second pinned magnetic pattern 215 except through the tunnel barrier patterns 212 and 214, and the free magnetic pattern 213. For the axially arranged read unit 210, the first pinned magnetic pattern 211 is arranged to be on the opposite side of the free magnetic pattern 213 from the second pinned magnetic pattern 215. That is, the first pinned magnetic pattern 211 is arranged to be axially separated along axis 216 from the second pinned magnetic pattern 215. The direction of the magnetization of the first pinned magnetic patterned 211 is anti-parallel to the direction of magnetization of the second pinned magnetic pattern PL 215. The direction of magnetization of the free magnetic pattern 213 is dipolar magnetically coupled to the free magnetic layer of a corresponding write unit (not shown in FIG. 2B), and may be parallel or anti-parallel to the magnetization directions of the first and second pinned magnetic patterns 211 and 215.

FIG. 2C depicts a cross-sectional view of an embodiment of a radially arranged write unit 220 according to the subject matter disclosed herein. The write unit 220 may include a first pinned magnetic pattern 221, a tunnel barrier pattern 222, a free magnetic pattern 223, and a second pinned magnetic pattern 224. The tunnel barrier pattern 222 separates the first pinned magnetic pattern 221 from the free magnetic pattern 223, and separates the second pinned magnetic pattern 224 from the free magnetic pattern 223. The first pinned magnetic pattern 221 is electrically isolated from the second pinned magnetic pattern 224 except through the tunnel barrier pattern 222 and the free magnetic pattern 223. For the radially arranged write unit 220, the first pinned magnetic pattern 221 is arranged to be on the same side of the free magnetic pattern 223 as the second pinned magnetic pattern 224. The direction of the magnetization of the first pinned magnetic pattern 221 is parallel to the direction of magnetization of the second pinned magnetic pattern 224 (i.e., in the same direction). The direction of magnetization of the free magnetic pattern 223 may be controlled in a well-known manner to be parallel or anti-parallel to the magnetization directions of the first and second pinned magnetic patterns 221 and 224.

FIG. 2D depicts a cross-sectional view of an embodiment of a radially arranged read unit 230 according to the subject matter disclosed herein. The read unit 230 may include a first pinned magnetic pattern 231, a tunnel barrier pattern 232, a free magnetic pattern 233, and a second pinned magnetic pattern 234. The tunnel barrier pattern 232 separates the first pinned magnetic pattern 231 from the free magnetic pattern 233, and separates the second pinned magnetic pattern 234 from the free magnetic pattern 233. The first pinned magnetic pattern 231 is electrically isolated from the second pinned magnetic pattern 2345 except through the tunnel barrier pattern 232 and the free magnetic pattern 233. For the radially arranged read unit 230, the first pinned magnetic pattern 231 is arranged to be on the same side of the free magnetic pattern 233 as the second pinned magnetic pattern 234. The direction of the magnetization of the first pinned magnetic pattern 231 is anti-parallel to the direction of magnetization of the second pinned magnetic pattern 224. The direction of magnetization of the free magnetic pattern 233 is exchange, or dipolar, magnetically coupled to the free magnetic layer of a corresponding write unit (not shown in FIG. 2D), and may be parallel or anti-parallel to the magnetization directions of the first and second pinned magnetic patterns 231 and 235.

Figure 3A:
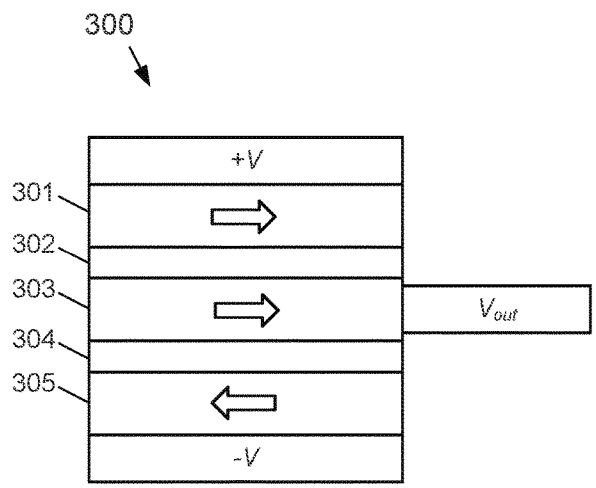
FIGS. 3A-3D depicts cross-sectional views of an axially arranged read unit and corresponding equivalent circuits to explain sensing of the state of a read unit according to the subject matter disclosed herein.
Figure 3B:
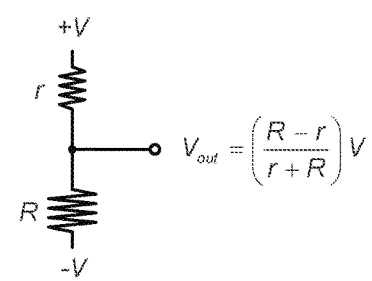
Figure 3C:
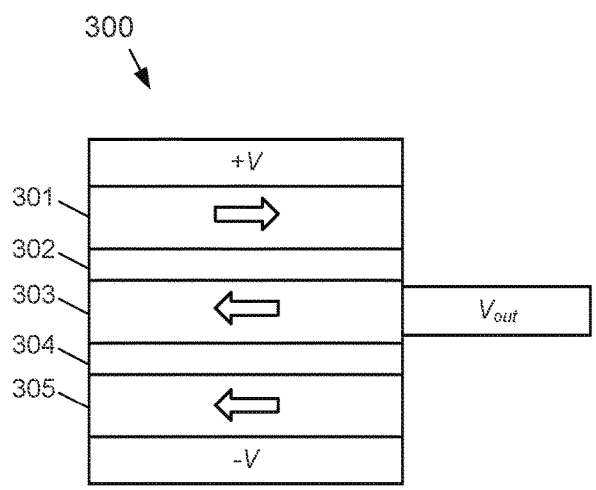
Figure 3D:
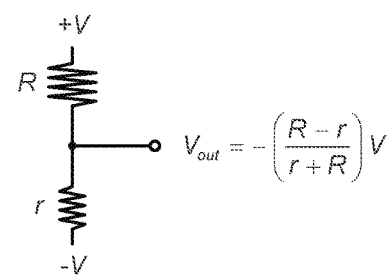

FIGS. 3A-3D depicts cross-sectional views of an axially arranged read unit 300 and corresponding equivalent circuits to explain sensing of the state of a read unit according to the subject matter disclosed herein. FIG. 3B depicts an equivalent circuit for the state of the read unit 300 depicted in FIG. 3A, and FIG. 3D depicts an equivalent circuit for the state of the read unit 300 depicted in FIG. 3C.

As depicted in FIGS. 3A and 3C, the read unit 300 may be configured similarly to the read unit 210 (FIG. 2B), and may include a first pinned magnetic pattern 301, a first tunnel barrier pattern 302, a free magnetic pattern 303, a second tunnel barrier pattern 304, and a second pinned magnetic pattern 305. To sense the state of the read unit 300, a voltage +V is applied to the first pinned magnetic pattern 301, and a voltage −V is applied to the second pinned magnetic pattern 305. The voltages +V and −V may be applied to word lines (not shown in FIG. 3A) respectively connected to the first pinned magnetic pattern 301 and the second pinned magnetic pattern 305. The state of the read unit 300 is represented by the voltage $V_{out}$ at the free magnetic pattern 303. If, as depicted in FIG. 3A, the magnetization direction of the free magnetic pattern 303 is in the same direction as the magnetization direction of the first pinned magnetic pattern 301, and anti-parallel to the magnetization direction of the second pinned pattern PL 305, then the voltage at the free magnetic pattern 303 is $$V_{out} = \left(\frac{R-r}{r+R}\right)V, \quad (1)$$

in which r represents the resistance between the first pinned magnetic pattern 301 and the free magnetic pattern 303, and R represents the resistance between the second pinned magnetic pattern 305 and the free magnetic pattern 303. The resistance r has a lower value of resistance than the resistance R; hence, the use of a lower case for resistance r (and the corresponding relatively smaller resistor schematic symbol), and the use of a capitalized case for resistance R (and the corresponding relatively larger resistor schematic symbol). For a tunnel magnetoresistance (TMR) of, for example, 200%, $$\frac{R-r}{r+R} \approx \frac{1}{2}, \quad (2)$$

and $$V_{out} = \pm\frac{1}{2}V. \quad (3)$$

If, as depicted in FIG. 3C, the magnetization direction of the free magnetic pattern 304 is anti-parallel to the magnetization direction of the first pinned magnetic pattern 301, and in the same direction as the magnetization direction of the second pinned magnetic pattern PL 305, then the voltage at the free magnetic pattern 303 is $$V_{out} = -\left(\frac{R-r}{r+R}\right)V. \quad (4)$$

Figure 4B:
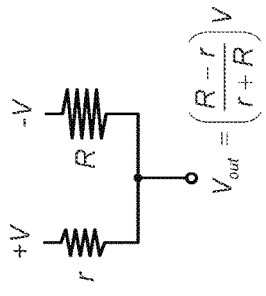
FIGS. 4A-4D depicts cross-sectional views of a radially arranged read unit and equivalent circuits to explain sensing of the state of a read unit according to the subject matter disclosed herein.
Figure 4D:
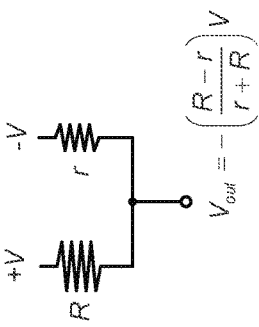
Figure 4A:
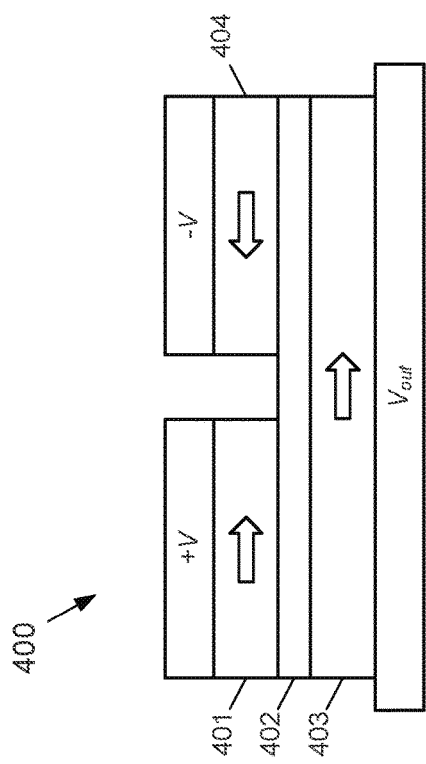

FIGS. 4A-4D depicts cross-sectional views of a radially arranged read unit 400 and equivalent circuits to explain sensing of the state of a read unit according to the subject matter disclosed herein. FIG. 4B depicts an equivalent circuit for the state of the read unit 400 depicted in FIG. 4A, and FIG. 4D depicts an equivalent circuit for the state of the read unit 400 depicted in FIG. 4C.

Figure 4C:
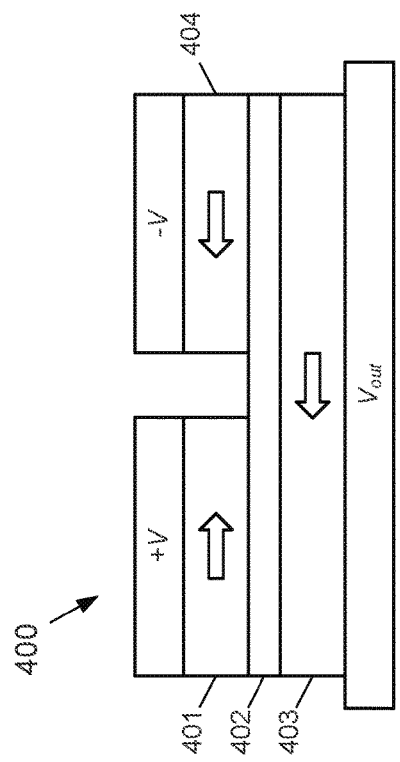

As depicted in FIGS. 4A and 4C, the read unit 400 may be configured similarly to the read unit 230 (FIG. 2D), and may include a first pinned magnetic pattern 401, a first tunnel barrier pattern 402, a free magnetic pattern 403, and a second pinned magnetic pattern 404. To sense the state of the read unit 400, a voltage +V is applied to the first pinned magnetic pattern 401, and a voltage −V is applied to the second pinned magnetic pattern 404. The voltages +V and −V may be applied to word lines (not shown in FIG. 4A) respectively connected to the first pinned magnetic pattern 401 and the second pinned magnetic pattern 404. The state of the read unit 400 is represented by the voltage $V_{out}$ at the free magnetic pattern 403. If, as depicted in FIG. 4A, the magnetization direction of the free magnetic pattern 403 is in the same direction as the magnetization direction of the first pinned magnetic pattern 401, and anti-parallel to the magnetization direction of the second pinned magnetic pattern 404, then the voltage at the free magnetic pattern 403 is given by Eq. (1).

If, as depicted in FIG. 4C, the magnetization direction of the free magnetic pattern 403 is anti-parallel to the magnetization direction of the first pinned magnetic pattern 401, and in the same direction as the magnetization direction of the second pinned magnetic pattern 404, then the voltage at the free magnetic pattern 403 is given by Eq. (4).

Figure 5A:
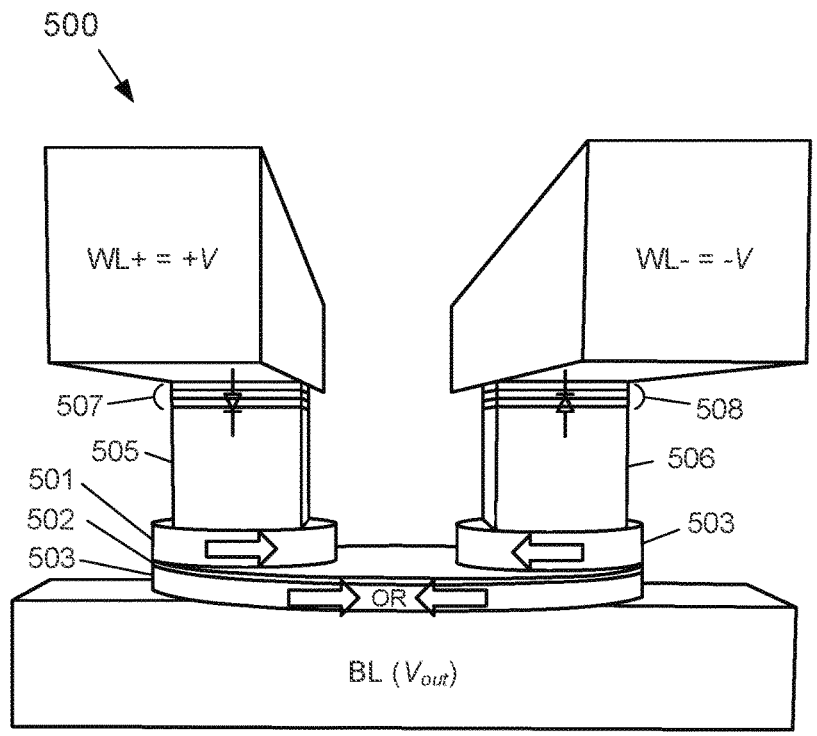
FIGS. 5A and 5B depict a physical configuration of an embodiment of a radially arranged read unit according to the subject matter disclosed herein.
Figure 5B:
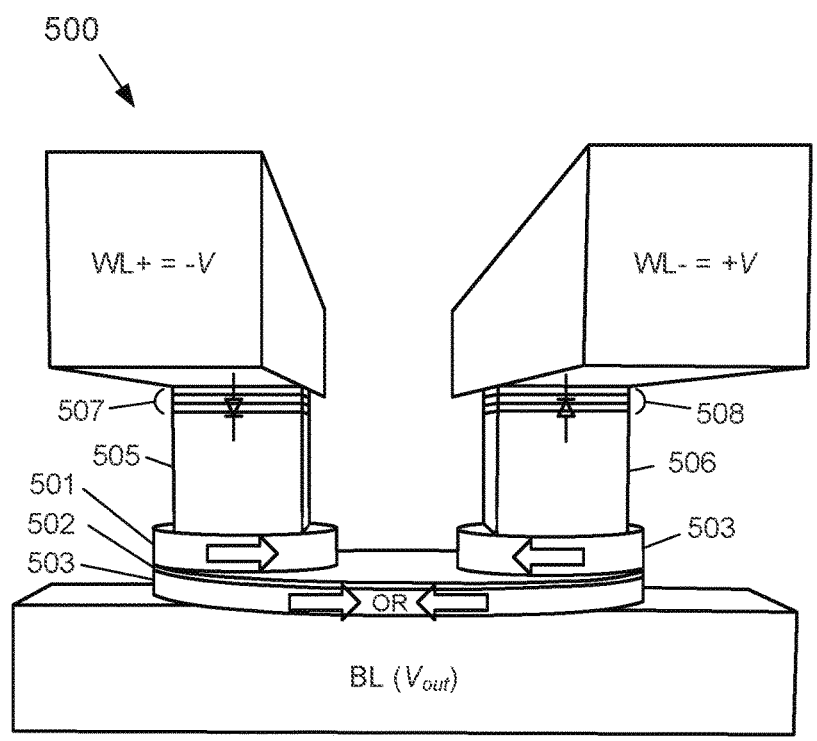

FIGS. 5A and 5B depict a physical configuration of an embodiment of a radially arranged read unit 500 according to the subject matter disclosed herein. The read unit 500 may include a first pinned magnetic pattern 501, a tunnel barrier pattern 502, a free magnetic pattern 503, and a second pinned magnetic pattern 504. The free magnetic pattern 503 is connected to a bit line BL. The read unit 500 further includes vias 505 and 506, and diodes 507 and 508. The vias 505 and 506 pass through an interlayer dielectric layer (ILD) (not shown). The via 505 and the diode 507 connect the first pinned magnetic pattern 501 to a word line WL+. The anode of the diode 507 is connected to the word line WL+, and the cathode of the diode 507 is connected to the via 505. The via 506 and the diode 508 connect the second pinned magnetic pattern 504 to a word line WL−. The anode of the diode 508 is connected to the via 506, and the cathode of the diode 508 is connected to the word line WL−. Schematic symbols for diodes 507 and 508 have been added to FIGS. 5A and 5B to aid understanding. Although the diodes 507 and 508 are depicted in FIGS. 5A and 5B as being formed between the word lines and the vias, it should be understood that the diodes 507 and 508 may be formed to be between the vias and the pinned magnetic patterns. As depicted by the arrows within the magnetic patterns in FIG. 5A, the magnetization direction of the first pinned pattern 501 is anti-parallel to the magnetization direction of the second pinned magnetic pattern 503. The magnetization direction of the free magnetic pattern 503 may be either direction.

If, as indicated in FIG. 5A, a voltage +V is applied to the word line WL+ and a voltage −V is applied to the word line WL−, the diodes 507 and 508 are forward biased and conduct. The biasing provided by the voltages on the word lines WL+ and WL− selects the read unit 500 and $V_{out}$ may be detected on the bit line BL. The state (i.e., the magnetization direction) of the free magnetic pattern 503 may be determined using Eqs. (1)-(4).

If, as indicated in FIG. 5B, a voltage −V is applied to the word line WL+ and a voltage +V is applied to the word line WL−, the diodes 507 and 508 are reversed biased and do not conduct. The read unit 500 is not selected, and the free magnetic layer FL 503 and the bit line BL float.

Figure 6A:
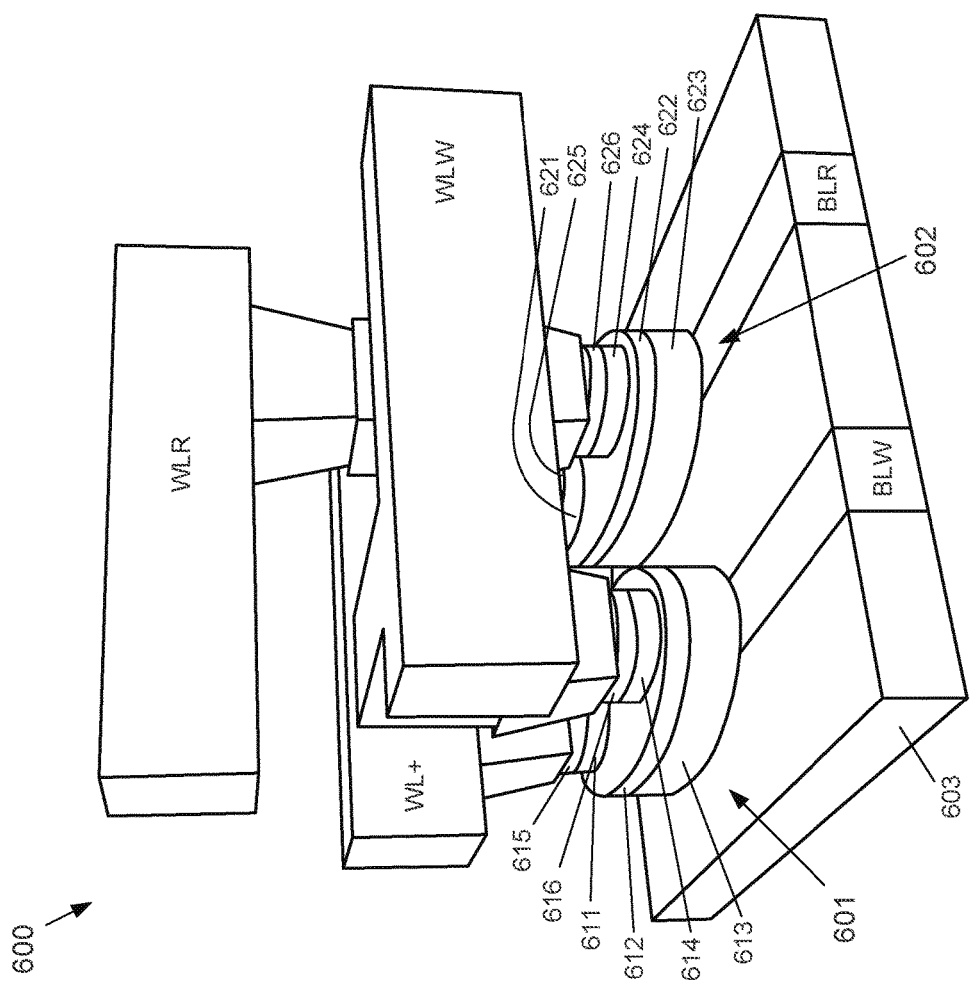
FIG. 6A depicts a perspective view of a physical configuration of an embodiment of a bidirectional memory cell according to the subject matter disclosed herein.
Figure 6B:
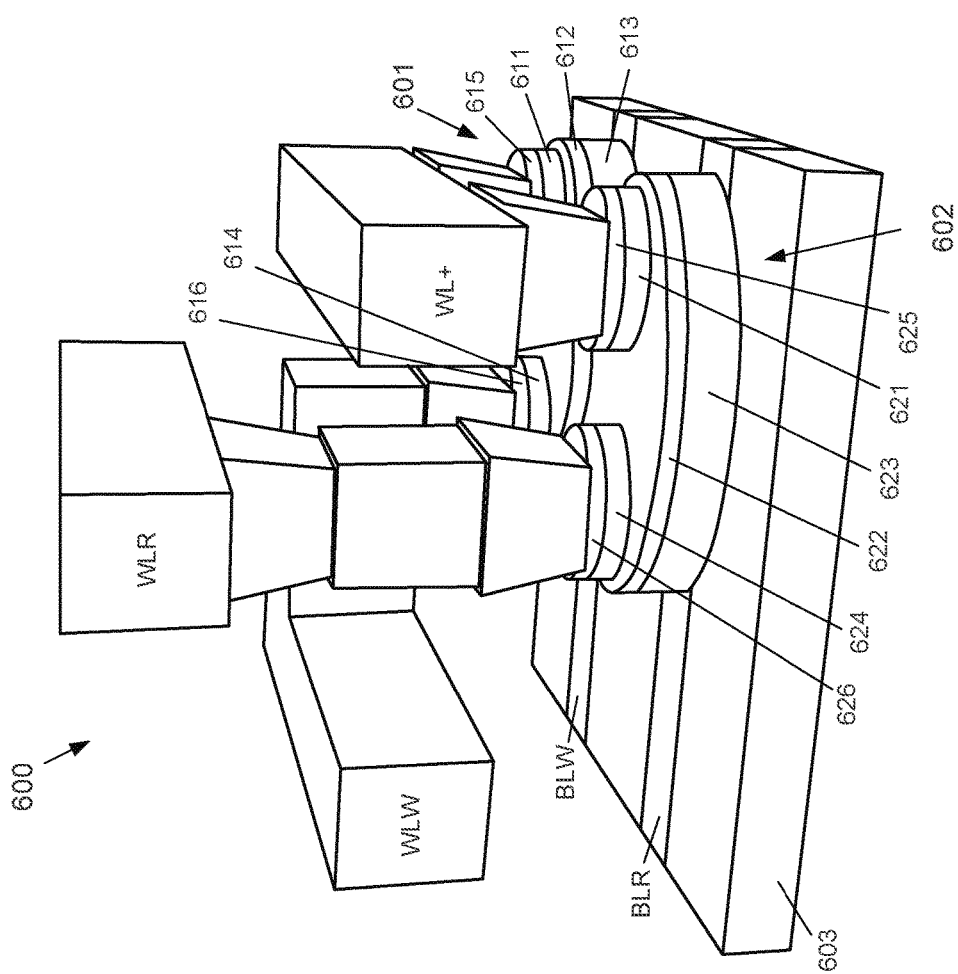
FIG. 6B depicts perspective view of the physical configuration of the bidirectional memory cell of FIG. 6A from another angle.

FIG. 6A depicts a perspective view of a physical configuration of an embodiment of a bidirectional memory cell 600 according to the subject matter disclosed herein. FIG. 6B depicts perspective view of the physical configuration of the bidirectional memory cell 600 from another angle.

The bidirectional memory cell 600 may include a radially arranged write unit 601 and a radially arranged read unit 602. The write unit 601 may include a first pinned magnetic pattern 611, a tunnel barrier pattern 612, a free magnetic pattern 613, a second pinned magnetic pattern 614, a first diode 615, and a second diode 616. The tunnel barrier pattern 612 separates the first pinned magnetic pattern 611 from the free magnetic pattern 613, and separates the second pinned magnetic pattern 612 from the free magnetic pattern 613. For the radial arrangement of the write unit 601, the first pinned magnetic pattern 611 is arranged to be on the same side of the free magnetic pattern 613 as the second pinned magnetic pattern 614. The first pinned magnetic pattern 611 is connected to a word line WL+ through the first diode 615. The second pinned magnetic pattern 614 is connected to a word line WLW through the second diode 616. The free magnetic pattern 613 is connected to a bit line BLW. As described in connection with FIGS. 2A, 2C, 7C and 7D, the magnetization directions of the first pinned magnetic pattern 611 and the second pinned magnetic pattern 614 of the write unit 601 are in the same direction. It should be understood that the word line WLW depicted in FIGS. 6A and 6B corresponds to the word line WL− in FIGS. 7C and 7D.

The read unit 602 may include a first pinned magnetic pattern 621, a tunnel barrier pattern 622, a free magnetic pattern 623, a second pinned magnetic pattern 624, a first diode 625, and a second diode 626. The tunnel barrier pattern 622 separates the first pinned magnetic pattern 621 from the free magnetic pattern 623, and separates the second pinned magnetic pattern 622 from the free magnetic pattern 623. For the radial arrangement of the read unit 602, the first pinned magnetic pattern 621 is arranged to be on the same side of the free magnetic pattern 623 as the second pinned magnetic pattern 624. The first pinned magnetic pattern 621 is connected to the word line WL+ through the first diode 625. The second pinned magnetic pattern 624 is connected to a word line WLR through the second diode 626. The free magnetic pattern 623 is connected to a bit line BLR. As described in connection with FIGS. 2B, 2D, 7A and 7B, the magnetization directions of the first pinned magnetic pattern 611 and the second pinned magnetic pattern 614 are anti-parallel to each other. It should be understood that the word line WLR depicted in FIGS. 6A and 6B corresponds to the word line WL− in FIGS. 7A and 7B.

In one embodiment, the bit lines BLW and BLR are formed in an ILD layer 603. Other ILD layers are not shown in FIGS. 6A and 6B for clarity. Additionally, various vias and/or plugs connecting, for example, the diodes to the word lines are not identified in FIGS. 6A and 6B for clarity.

In an alternative embodiment, a bidirectional memory cell may include a combination of radially arranged units (either write units or read units) and axially arranged units (either write units or read units). Additionally, in another alternative embodiment, a bidirectional memory may be configured so that bit lines are used in place of the word lines indicated herein, and so that word lines are used in place of bit lines indicated herein. In such an alternative embodiment, the various potentials used to select a write or a read unit would be applied to the corresponding bit lines, and the word lines would be used to write or sense a state.

Figure 7A:
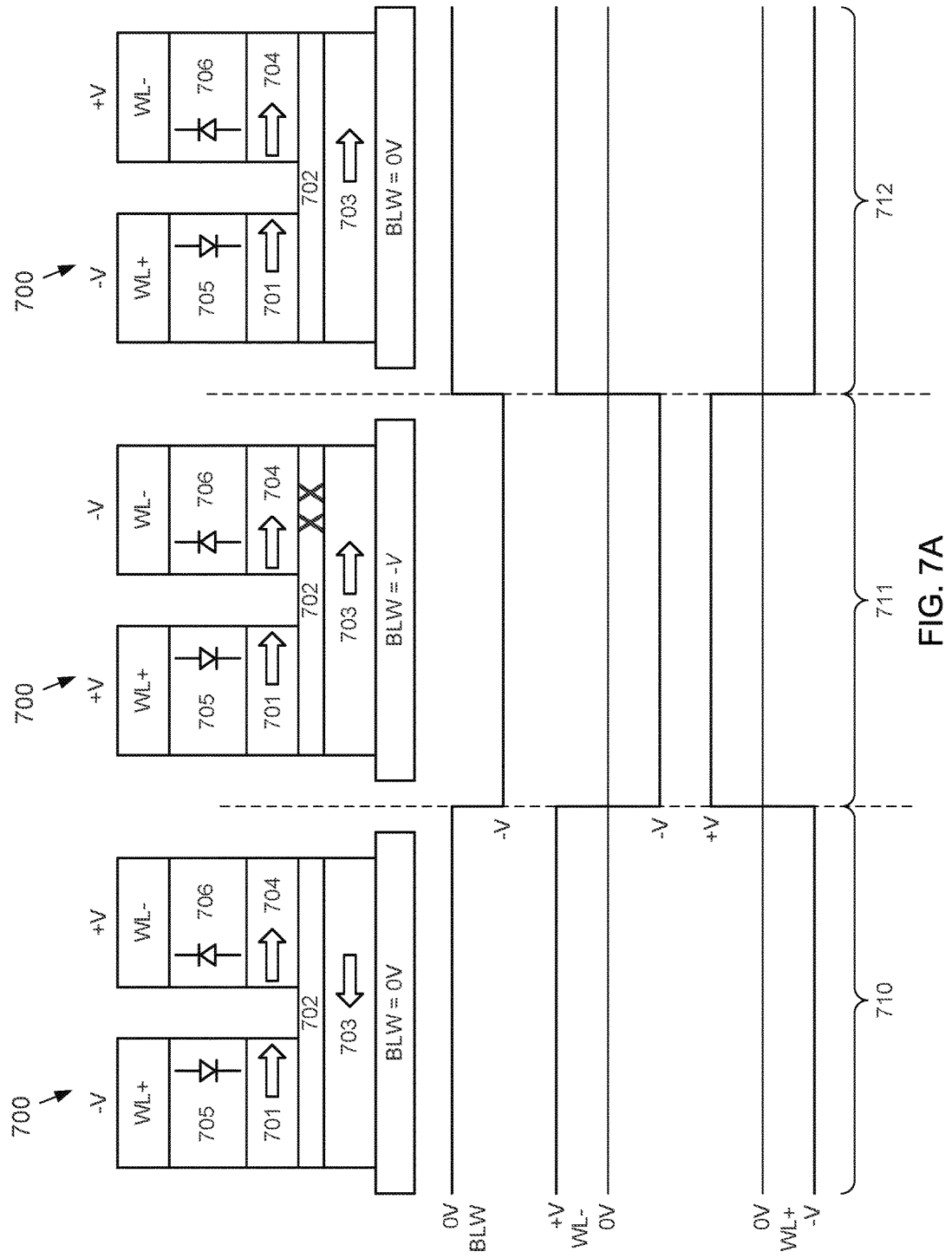
FIGS. 7A and 7B depict sequences of an example writing operation of a radially arranged write unit according to the subject matter disclosed herein.
Figure 7B:
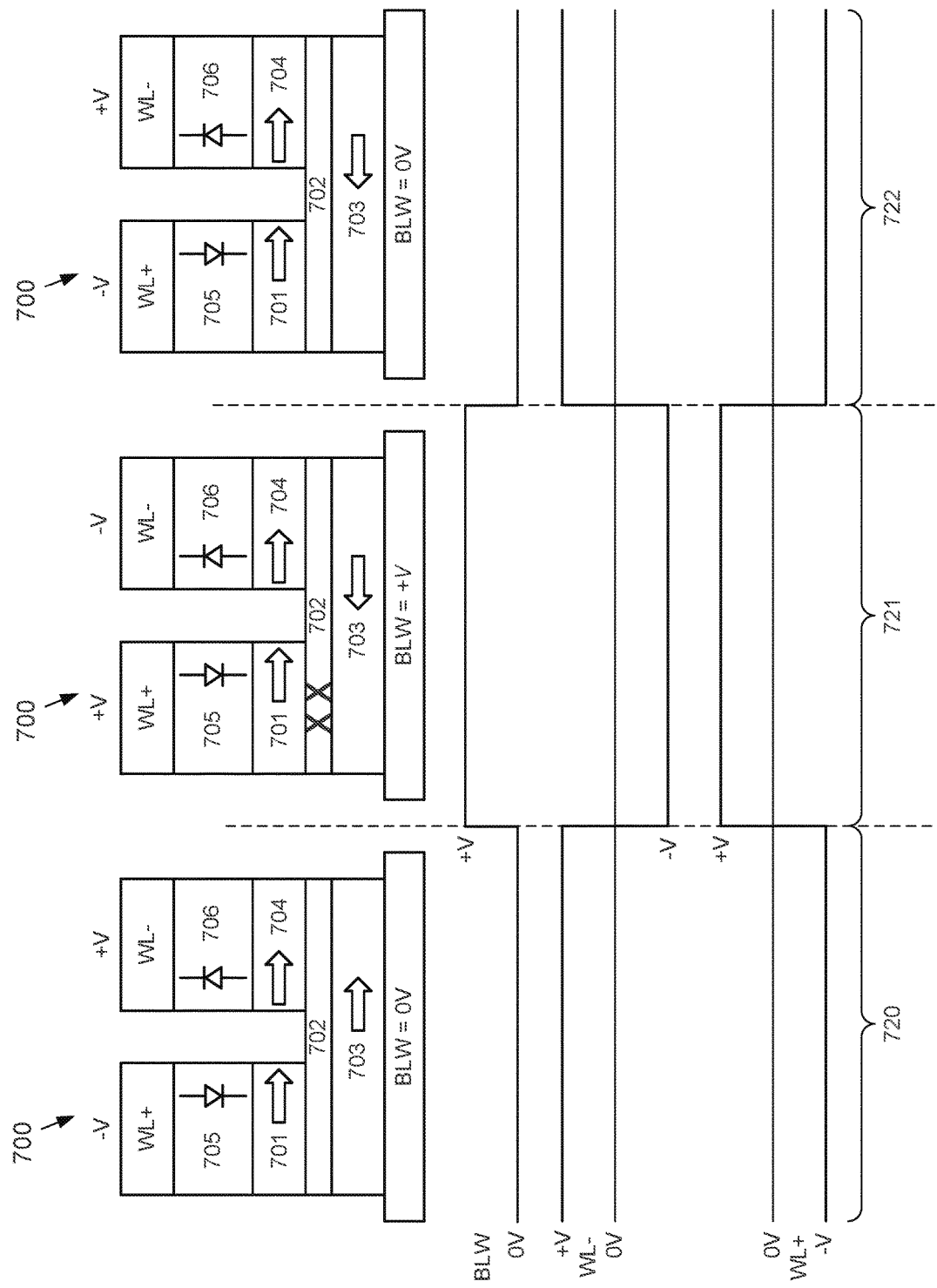

FIGS. 7A and 7B depict sequences of an example writing operation of a radially arranged write unit 700 according to the subject matter disclosed herein. FIG. 7A, in particular, depicts sequences of an example write operation of the write unit 700 in which the polarization direction of the free magnetic pattern is changed from being anti-parallel to the magnetization direction of the first and second pinned magnetic patterns to being in the same direction as the magnetization of the first and second pinned magnetic patterns. FIG. 7B depict sequences of an example write operation of the write unit 700 in which the polarization direction of the free magnetic pattern is changed from being in the same direction as the magnetization of the first and second pinned magnetic patterns to being anti-parallel to the magnetization direction of the first and second pinned magnetic patterns.

In FIGS. 7A and 7B, the write unit 700 may include a first pinned magnetic pattern 701, a tunnel barrier pattern 702, a free magnetic pattern 703, a second pinned magnetic pattern 704, a first diode 705 and a second diode 706. The first pinned magnetic pattern 701 is connected to the word line WL+ through the diode 705, and the second pinned magnetic pattern 704 is connected to the word line WL− through the diode 706. The free magnetic layer 703 is connected to the bit line BLW.

In FIG. 7A, the write unit 700 is initially unselected, as indicated at 710. That is, the word line WL+ is at −V, the word line WL− is at +V, and the bit line BLW is at 0V. At 711, the read unit 700 is selected. That is, the word line WL+ changes to be +V, and the word line WL− changes to be −V. The bit line BLW changes to −V and current flows from the word line WL+ to the bit line BLW. The "XX" in the tunnel barrier layer 702 represents no current flowing between the free magnetic pattern 703 and the word line WL−. The magnetization direction of the free magnetic pattern 703 changes to be in the same direction as the magnetization direction of the first and second pinned magnetic patterns 701 and 704. The change written into the write unit 700 is exchange, or dipolar, coupled to a read unit (not shown) corresponding to the write unit 700. At 712, the write unit 700 becomes unselected, and the word line WL+ is at −V, the word line WL− is at +V, and the bit line BLW is at 0V.

In FIG. 7B, the write unit 700 is initially unselected, as indicated at 720. That is, the word line WL+ is at −V, the word line WL− is at +V, and the bit line BLW is at 0V. At 721, the read unit 700 is selected. The word line WL+ changes to be +V, and the word line WL− changes to be −V. The bit line BLW changes to +V and current flows from the bit line BLW to the word line WL−. The "XX" in the tunnel barrier pattern 702 represents no current flowing between the word line WL+ and the free magnetic pattern 703. The magnetization direction of the free magnetic pattern 703 changes to be anti-parallel to the magnetization direction of the first and second pinned magnetic patterns 701 and 704. The change written into the write unit 700 is exchange, or dipolar, coupled to a read unit corresponding to the write unit 700. At 722, the write unit 700 becomes unselected, and the word line WL+ is at −V, the word line WL− is at +V, and the bit line BLW is at 0V.

Figure 7C:
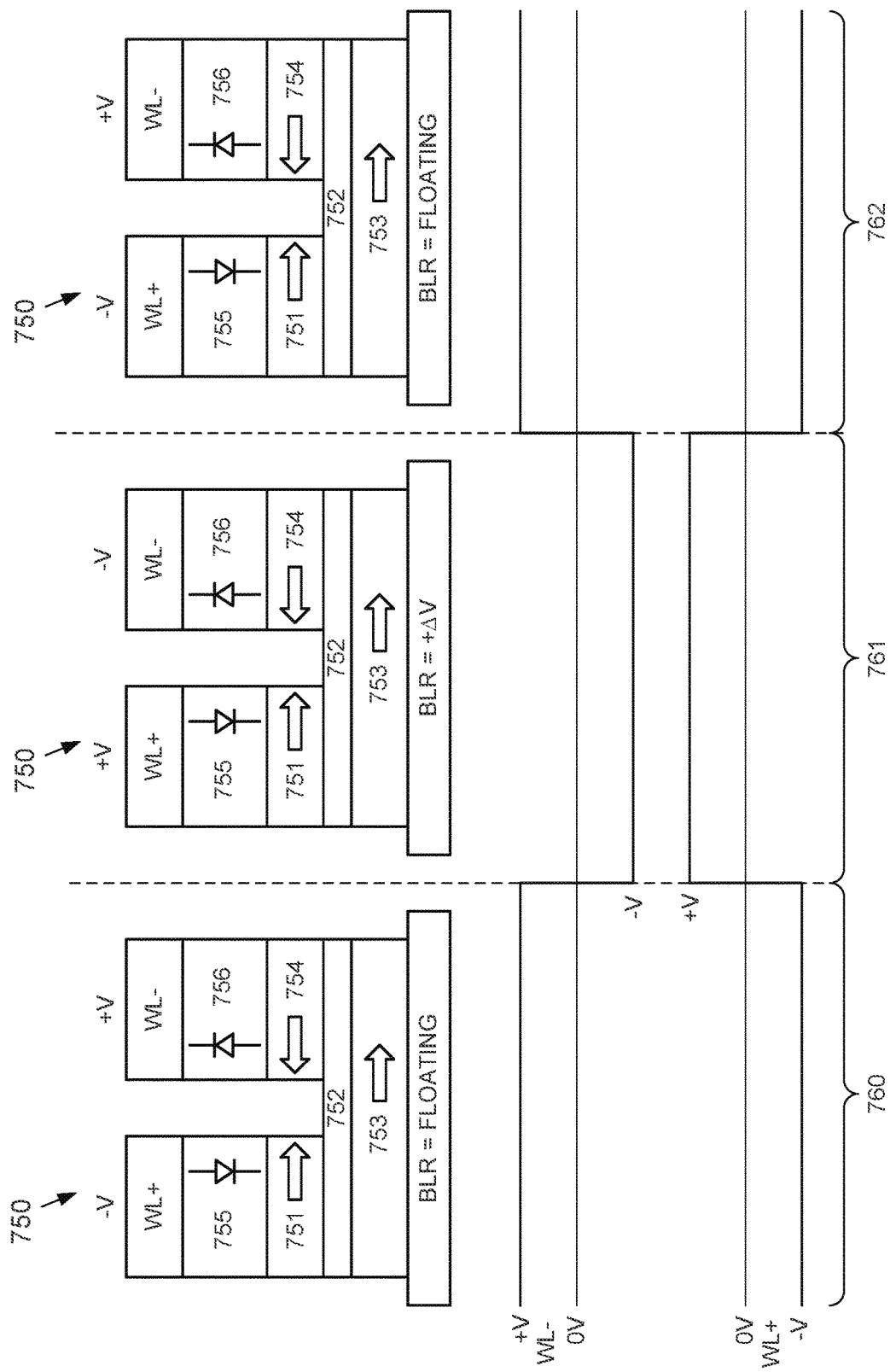
FIGS. 7C and 7D depict sequences of an example reading operation of a radially arranged read unit according to the subject matter disclosed herein.
Figure 7D:
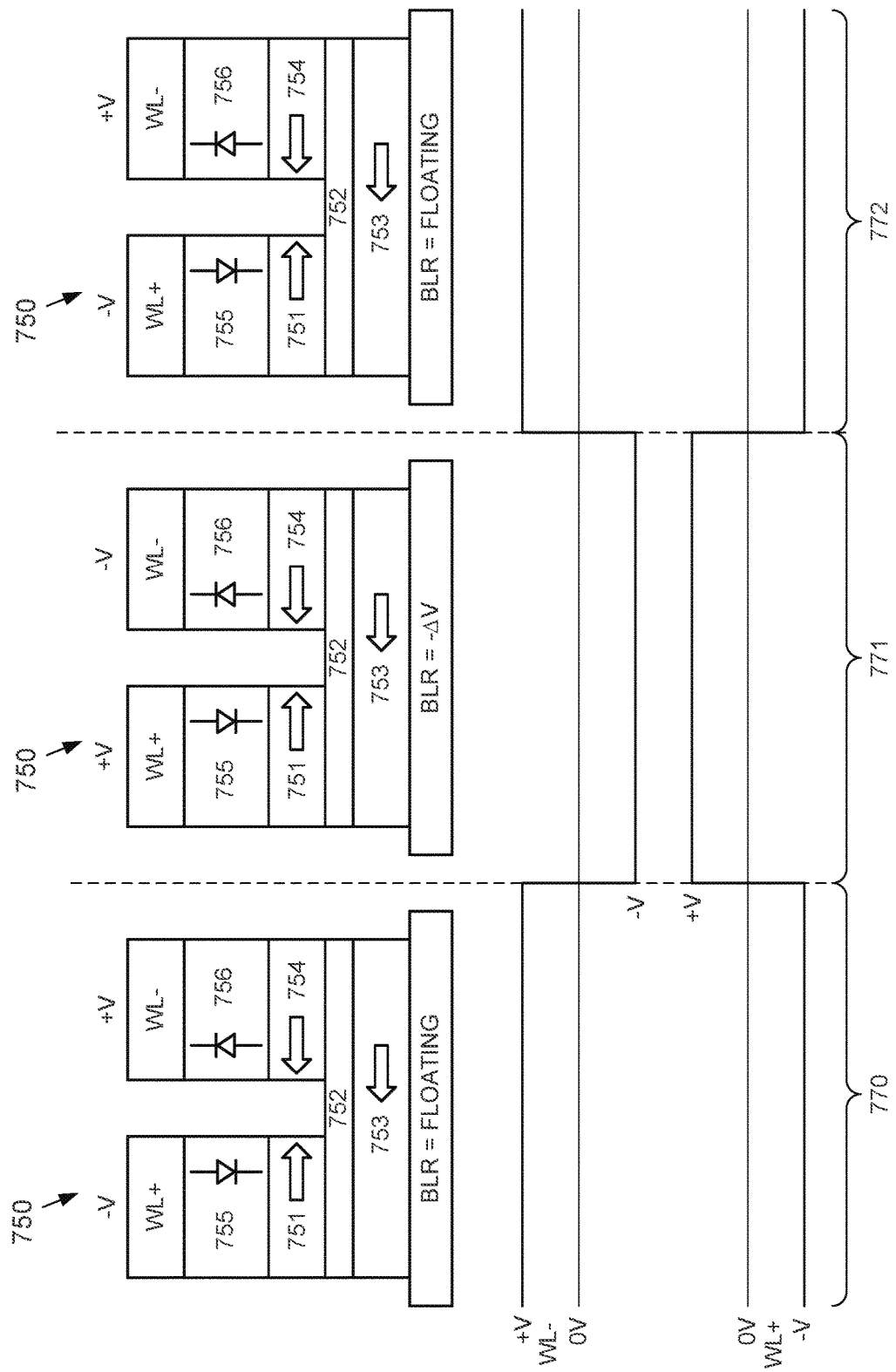

FIGS. 7C and 7D depict sequences of an example reading operation of a radially arranged read unit 750 according to the subject matter disclosed herein. FIG. 7C, in particular, depicts sequences of an example reading operation of the read unit 750 in which $V_{out}$ output from the free magnetic pattern is a positive voltage. FIG. 7D depicts sequences of an example reading operation of the read unit 700 in which $V_{out}$ output from the free magnetic pattern is a negative voltage.

In FIGS. 7C and 7D, the read unit 750 may include a first pinned magnetic pattern 751, a tunnel barrier pattern 752, a free magnetic pattern 753, a second pinned magnetic pattern 754, a first diode 755 and a second diode 756. The first pinned magnetic pattern 751 is connected to the word line WL+ through the diode 755, and the second pinned magnetic pattern 754 is connected to the word line WL− through the diode 756. The free magnetic pattern 753 is connected to the bit line BLR. In FIG. 7C, the magnetization direction of the free magnetic pattern 753 is in the same direction as the magnetization direction of the first pinned magnetic pattern 751, and is anti-parallel to the magnetization direction of the second pinned magnetic pattern 754. Initially, the read unit 750 is unselected, as indicated at 760. In particular, the word line WL+ is at −V, the word line WL− is at +V, and the bit line BLR connected to the free magnetic pattern 753 is floating. At 761, the read unit 750 is selected. The word line WL+ changes to be +V, and the word line WL− changes to be −V. The bit line BLR connected to the free magnetic pattern 753 becomes +ΔV. In this case, +ΔV would be determined by Eq. (1). At 762, the read unit 700 becomes unselected, and the word line WL+ is at −V, the word line WL− is at +V, and the bit line BLR connected to the free magnetic pattern 753 is floating.

In FIG. 7D, the magnetization direction of the free magnetic pattern 753 is anti-parallel to the magnetization direction of the first pinned magnetic pattern 754, and is in the same direction as the magnetization direction of the second pinned magnetic pattern 754. In this read sequence, the read unit 750 is initially unselected, as indicated at 770. In particular, the word line WL+ is at −V, the word line WL− is at +V, and the bit line BLR connected to the free magnetic pattern 753 is floating. At 771, the read unit 750 is selected. The word line WL+ changes to be +V, and the word line WL− changes to be −V. The bit line BLR connected to the free magnetic pattern 753 becomes +ΔV. In this case, +ΔV would be determined by Eq. (4). At 772, the read unit 750 becomes unselected, and the word line WL+ is at −V, the word line WL− is at +V, and the bit line BLR connected to the free magnetic pattern 753 is floating.

Figure 8:
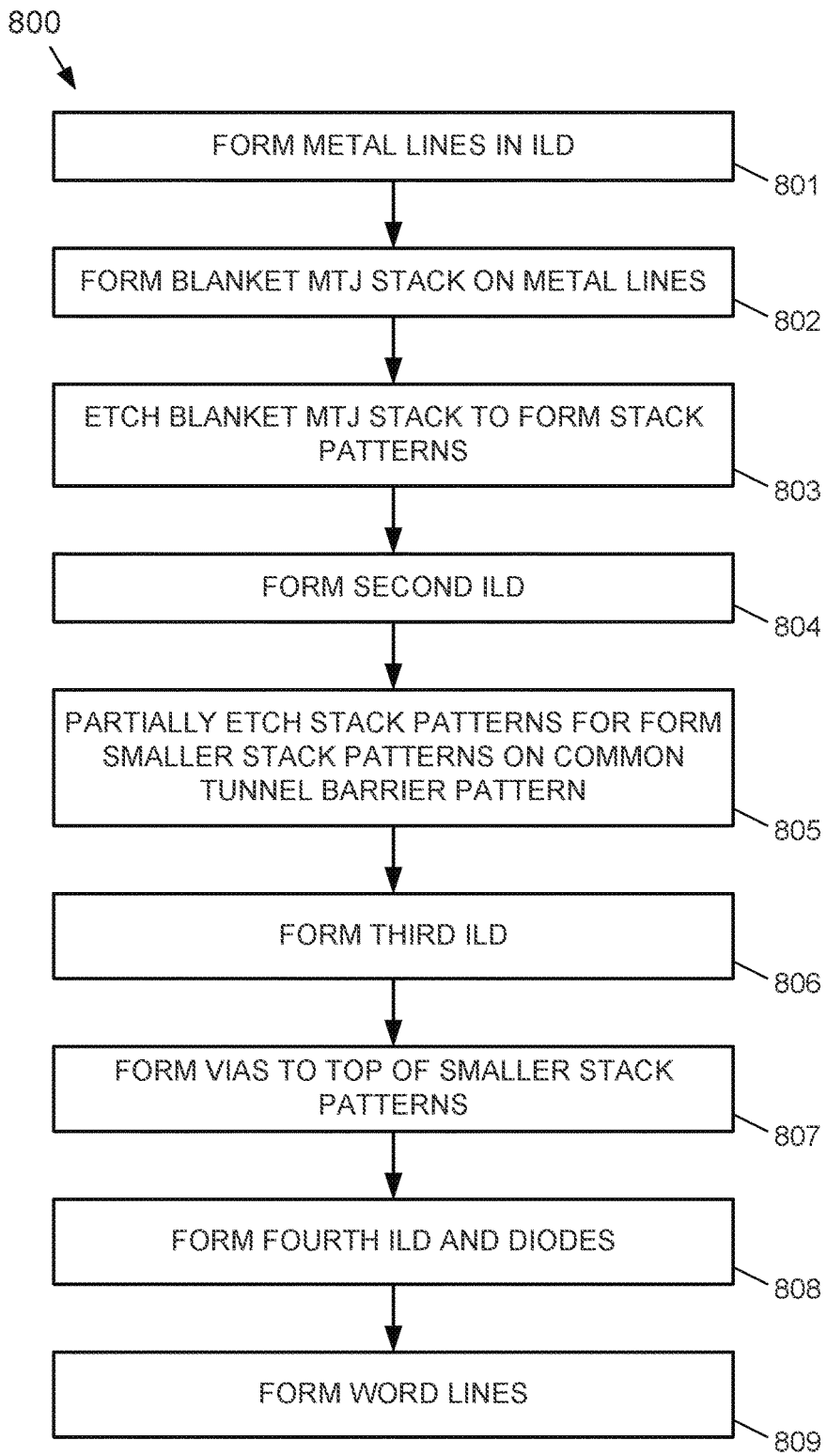
FIG. 8 depicts an example embodiment of a method to form a radially arranged memory cell of a bidirectional memory according to the subject matter disclosed herein.

FIG. 8 depicts an example embodiment of a method 800 to form a radially arranged memory cell of a bidirectional memory according to the subject matter disclosed herein. FIGS. 9A-9H depict a radially arranged memory cell 900 at various stages of the method 800. In one embodiment, method 800 is performed during BEOL processing.

At 801 in FIG. 8, two metal lines 902 and 903 (FIG. 9A) are formed in a well-known manner in an ILD 901. One metal line (line 902) will become a bit line BLW and the other metal line (line 903) will become a bit line BLR.

At 802, a blanket MTJ stack 904 (FIG. 9B) is formed on the bit lines BLW and BLR in the following order. A capping layer 905 is formed in contact with the metal lines 902 and 903. A ferromagnetic free layer 906 is formed on the capping layer 905. A tunnel barrier layer 907, such as MgO, is formed on the ferromagnetic free layer 906. A ferromagnetic pinned layer 908 is formed on the tunnel barrier layer 907. A capping layer 909 is formed on the ferromagnetic pinned layer 908. There are many variations that are suitable for the MTJ stack 904, such as, but not limited to, the number of multi-layers forming a particular layer, the materials used, and the thicknesses of the respective layers. For example, one embodiment of an in-plane MTJ includes Ta(30Å)/CoFeB(15Å)/MgO(11Å)/Ta(100Å).

At 803, the blanket MTJ stack 904 is etched down to the ILD/metal layer using a well-known etching technique to form two stack patterns 910 and 920 (FIG. 9C) that are adjacent to each other. For the embodiment depicted in FIG. 9, the stack pattern 910 will become a write unit, and the stack pattern 920 will become a read unit. In one embodiment, each stack pattern 910 and 920 has an elliptical shape when viewed in a plan view. In one embodiment, the long axis of the elliptical shape of a stack pattern is substantially centered on a respective one of the metal lines 902 and 903. More specifically, the stack pattern 910, which will become the write unit, is substantially centered over the metal line 901, which will become the bit line BLW. The stack pattern 920, which will become the read unit, is substantially centered over the metal line 902, which will become the bit line BLR.

At 804, a second ILD 912 (FIG. 9D) is formed on the elliptical-shaped stack patterns, and the second ILD 912 is planarized using, for example, a well-known chemical-mechanical planarization (CMP) technique so that the top surfaces of the MTJ stack patterns 910 and 911 are exposed.

Figure 9A:
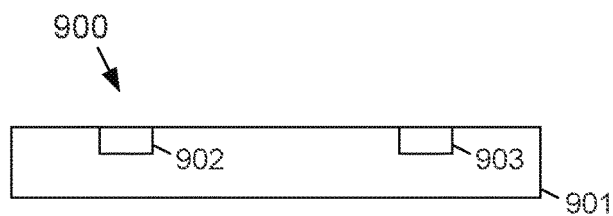
FIGS. 9A-9H depict a radially arranged memory cell at various stages of the method depicted in FIG. 8.
Figure 9B:
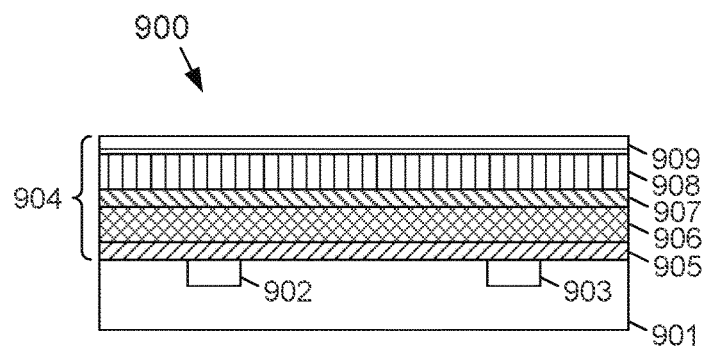
Figure 9C:
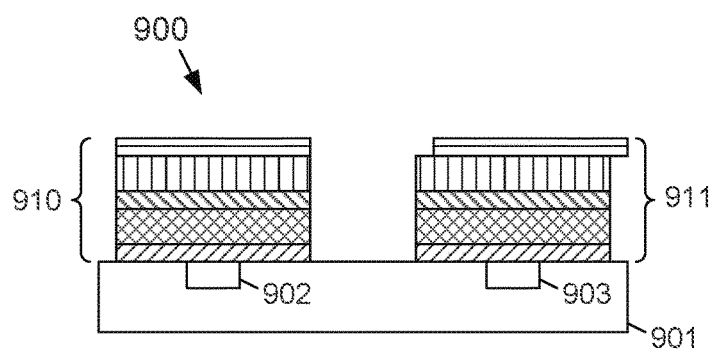
Figure 9D:
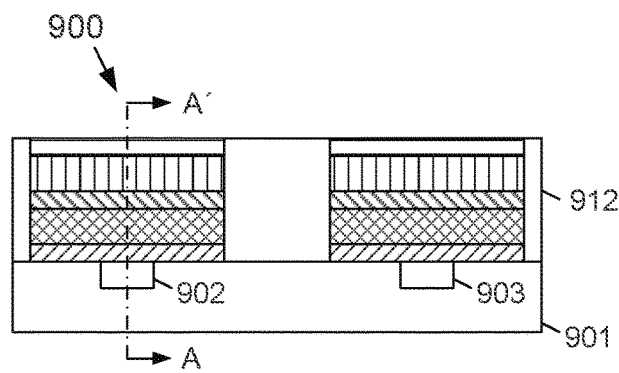
Figure 9E:
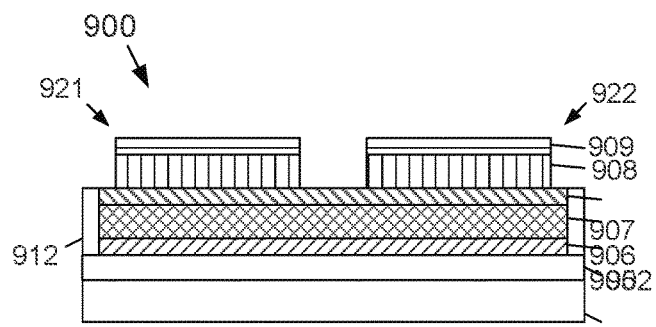
Figure 9F:
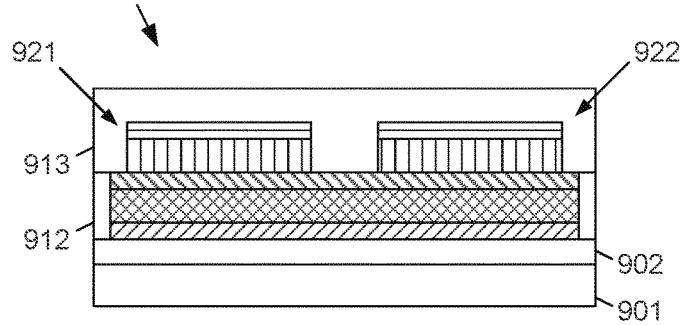

At 805, each of the stack patterns are partially etched in a well-known manner to form two smaller stack patterns 921 and 922 (FIG. 9E) that include the top capping layer 909 and the pinned ferromagnetic layer 908 remaining on the common tunnel barrier layer 907. In one embodiment, the etch process is selective and used the tunnel barrier layer 907 as an etch stop. It should be understood that while FIG. 9E depicts the two smaller stack patterns 921 and 922 for the write unit, two similar smaller stack patterns are formed for the read unit, but are not shown. In one embodiment, the upper portion (i.e., layers 909 and 908) of each of the two smaller stack patterns 921 and 922 has an elliptical shape when viewed in a plan view. In one embodiment, the long axis of the elliptical shape of the upper portion of a smaller stack pattern 921 (922) is substantially centered on the metal line 902 (903).

At 806, a third ILD layer 913 is formed on the smaller elliptical-shaped stack patterns (FIG. 9F), and the second ILD 912 is planarized using, for example, a well-known chemical-mechanical planarization (CMP) technique so that the top surface of the third ILD layer 913 is at one substantially uniform height over the top surfaces of the smaller stack patterns 921 and 922.

Figure 9G:
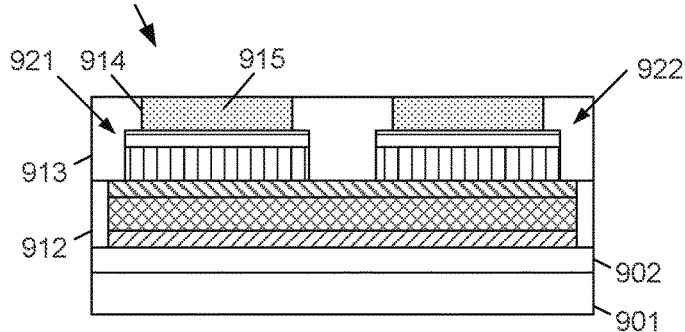

At 807, via holes 914 are formed in the third ILD 913 to expose the top surfaces of the two smaller stack patterns 921 and 922 for the write unit, and the top surfaces of the two smaller stack patterns (not shown) for the read pattern. Each via hole 914 is then filled with, for example, a metal material, using a well-known technique for form vias 915, and then a well-known CMP process is used to form the top surfaces of the vias to be substantially planar with the top surface of the third ILD layer 913 (FIG. 9G).

Figure 9H:
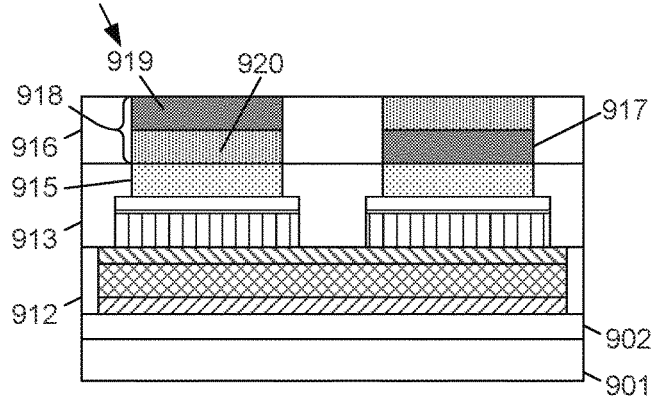

At 808, a fourth ILD 916 is formed and holes 917 are etched to expose the top surfaces of the vias 915. Holes 917 are filled with semiconductor materials to form diodes 918, each having an anode 919 and a cathode 920 (FIG. 9H).

At 809, additional ILD layers (not shown) are formed and etched to define the three word lines WLW, WLR and WL+, as depicted in FIGS. 6A and 6B. The word lines WLW, WLR and WL+ are metalized using a well-known technique. In one embodiment, barrier layers may be formed between the additional ILD layers and the metalized word lines.

Figure 10:
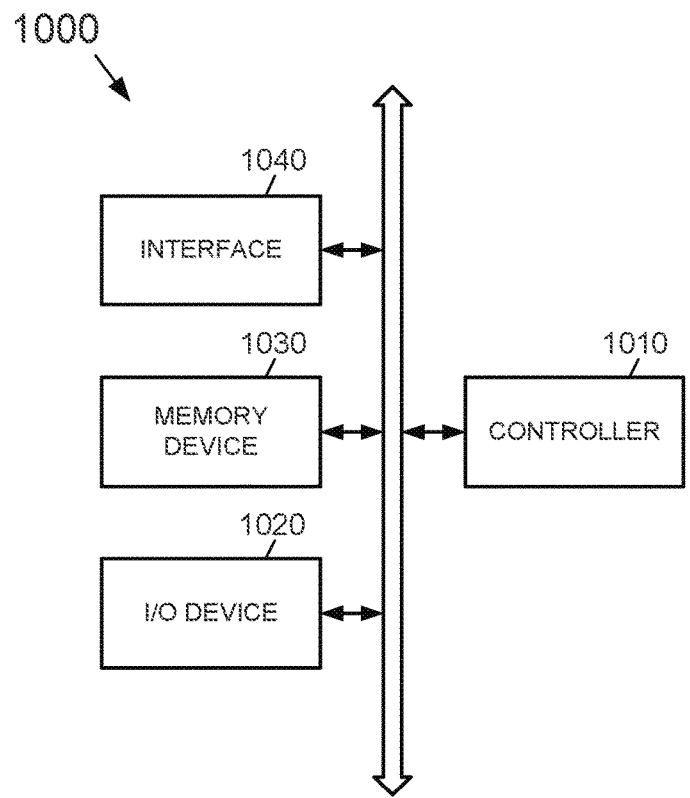
FIG. 10 depicts an electronic device that includes one or more integrated circuits (chips) that include a bidirectional memory according to the subject matter disclosed herein.

FIG. 10 depicts an electronic device 1000 that includes one or more integrated circuits (chips) that include a bidirectional memory according to the subject matter disclosed herein. Electronic device 1000 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 1000 may include a controller 1010, an input/output device 1020 such as, but not limited to, a keypad, a keyboard, a display, or a touch-screen display, a memory 1030, and a wireless interface 1040 that are coupled to each other through a bus 1050. The controller 1010 may include, for example, at least one microprocessor, at least one digital signal process, at least one microcontroller, or the like. The memory 1030 may be configured to store a command code to be used by the controller 1010 or a user data. Electronic device 1000 and the various system components including electronic device 1000 may include a bidirectional memory according to the subject matter disclosed herein. The electronic device 1000 may use a wireless interface 1040 configured to transmit data to or receive data from a wireless communication network using a RF signal. The wireless interface 1040 may include, for example, an antenna, a wireless transceiver and so on. The electronic system 1000 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution - Advanced (LTE-Advanced), Multichannel Multipoint Distribution Service (MMDS), and so forth.

Figure 11:
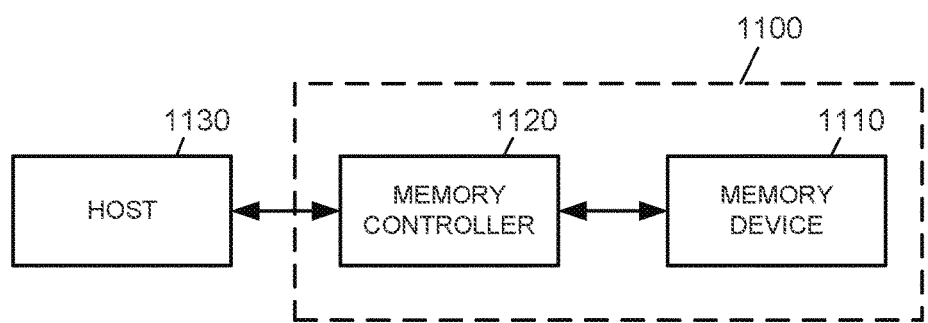
FIG. 11 depicts a memory system that may include a bidirectional memory according to the subject matter disclosed herein.

FIG. 11 depicts a memory system 1100 that may include a bidirectional memory according to the subject matter disclosed herein. The memory system 1100 may include a memory device 1110 for storing large amounts of data and a memory controller 1120. The memory controller 1120 controls the memory device 1110 to read data stored in the memory device 1110 or to write data into the memory device 1110 in response to a read/write request of a host 1130. The memory controller 1120 may include an address-mapping table for mapping an address provided from the host 1130 (e.g., a mobile device or a computer system) into a physical address of the memory device 1110. The memory device 1110 may include one or more semiconductor devices that include a bidirectional memory according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:
1. A bidirectional memory unit, comprising:
    a free magnetic layer electrically coupled to a bit line;
    a first pinned magnetic layer and a second pinned magnetic layer separated from the free magnetic layer by at least one tunnel barrier layer;

a first diode comprising an anode and a cathode, the anode of the first diode being coupled to a first word line and the cathode of the first diode being electrically coupled to the first pinned magnetic layer; and a second diode comprising an anode and a cathode, the anode of the second diode being electrically coupled to the second pinned magnetic layer and the cathode of the second diode being electrically coupled to a second word line.

2. The bidirectional memory unit according to claim 1, wherein the bidirectional memory unit is a radially arranged memory unit, and wherein the first pinned magnetic layer and the second pinned magnetic layer are separated from the free magnetic layer by a single tunnel barrier layer.

3. The bidirectional memory unit according to claim 2, wherein the first pinned magnetic layer and the second pinned magnetic layer are on a same side of the single tunnel barrier layer from the free magnetic layer.

4. The bidirectional memory unit according to claim 2, wherein the bidirectional memory unit is a write unit or a read unit.

5. The bidirectional memory unit according to claim 4, wherein the memory unit comprises a read unit, and wherein a state of the free magnetic layer is detected by sensing a voltage at the free magnetic layer if the first and second diodes are forward biased.

6. The bidirectional memory unit according to claim 1, wherein the bidirectional memory unit is an axially arranged memory unit, and wherein the first pinned magnetic layer is separated from the free magnetic layer by a first tunnel barrier layer and the second pinned magnetic layer is separated from the free magnetic layer by a second tunnel barrier layer.

7. The bidirectional memory unit according to claim 6, wherein the first pinned magnetic layer and the second pinned magnetic layer are on opposite sides of the free magnetic layer.

8. The bidirectional memory unit according to claim 6, wherein the bidirectional memory unit is a write unit or a read unit.

9. The bidirectional memory unit according to claim 8, wherein the memory unit comprises a read unit, and wherein a state of the free magnetic layer is detected by sensing a voltage at the free magnetic layer if the first and second diodes are forward biased.

10. The bidirectional memory unit according to claim 1, wherein the bidirectional memory unit is a write unit of a bidirectional memory cell, the bidirectional memory cell further comprising a read unit, the read unit comprising:

a second free magnetic layer electrically coupled to a second bit line and magnetically coupled to the free magnetic layer of the write unit;

a third pinned magnetic layer and a fourth pinned magnetic layer separated from the second free magnetic layer by at least one second tunnel barrier layer;

a third diode comprising an anode and a cathode, the anode of the third diode being coupled to a third word line and the cathode of the third diode being electrically coupled to the third pinned magnetic layer; and a fourth diode comprising an anode and a cathode, the anode of the fourth diode being electrically coupled to the fourth pinned magnetic layer and the cathode of the second diode being electrically coupled to a fourth word line.

11. The bidirectional memory unit according to claim 10, wherein the write unit and the read unit are radially arranged memory units, wherein the first pinned magnetic layer and the second pinned magnetic layer are separated from the free magnetic layer of the write unit by a first tunnel barrier layer, and wherein the third pinned magnetic layer and the fourth pinned magnetic layer are separated from the second free magnetic layer of the read unit by a second tunnel barrier layer.

12. The bidirectional memory unit according to claim 10, wherein the write unit and the read unit are axially arranged memory units, wherein the first pinned magnetic layer is separated from the free magnetic layer of the write unit by a first tunnel barrier layer and the second pinned magnetic layer is separated from the free magnetic layer of the write unit by a second tunnel barrier layer, and wherein the third pinned magnetic layer is separated from the second free magnetic layer of the read unit by a third tunnel barrier layer and the fourth pinned magnetic layer is separated from the second free magnetic layer of the read unit by a fourth tunnel barrier layer.

13. A bidirectional memory cell, comprising:

a write unit and a read unit, the write unit comprising:

a first free magnetic layer electrically coupled to a first bit line;

a first pinned magnetic layer and a second pinned magnetic layer separated from the first free magnetic layer by at least one write-unit tunnel barrier layer;

a first diode comprising an anode and a cathode, the anode of the first diode being coupled to a first word line and the cathode of the first diode being electrically coupled to the first pinned magnetic layer; and a second diode comprising an anode and a cathode, the anode of the second diode being electrically coupled to the second pinned magnetic layer and the cathode of the second diode being electrically coupled to a second word line; and the read unit comprising:

a second free magnetic layer electrically coupled to a second bit line and magnetically coupled to the first free magnetic layer of the write unit;

a third pinned magnetic layer and a fourth pinned magnetic layer separated from the second free magnetic layer by at least one read-unit tunnel barrier layer;

a third diode comprising an anode and a cathode, the anode of the third diode being coupled to a third word line and the cathode of the third diode being electrically coupled to the third pinned magnetic layer; and a fourth diode comprising an anode and a cathode, the anode of the fourth diode being electrically coupled to the fourth pinned magnetic layer and the cathode of the second diode being electrically coupled to a fourth word line.

14. The bidirectional memory cell according to claim 13, wherein the write unit and the read unit are radially arranged memory units, wherein the first pinned magnetic layer and the second pinned magnetic layer are separated from the first free magnetic layer of the write unit by a single write-unit tunnel barrier layer, and wherein the third pinned magnetic layer and the fourth pinned magnetic layer are separated from the second free magnetic layer of the read unit by a single read-unit tunnel barrier layer.

15. The bidirectional memory unit according to claim 13, wherein the write unit and the read unit are axially arranged memory units,
   wherein the first pinned magnetic layer is separated from the first free magnetic layer of the write unit by a first write-unit tunnel barrier layer and the second pinned magnetic layer is separated from the first free magnetic layer of the write unit by a second write-unit tunnel barrier layer, and
   wherein the third pinned magnetic layer is separated from the second free magnetic layer of the read unit by a first read-unit tunnel barrier layer and the fourth pinned magnetic layer is separated from the second free magnetic layer of the read unit by a second read-unit tunnel barrier layer.

16. The bidirectional memory unit according to claim 13, wherein a state of the second free magnetic layer is detected by sensing a voltage at the second free magnetic layer if the third and fourth diodes are forward biased.

17. A bidirectional memory cell, comprising:
   a write unit and a read unit,
   the write unit comprising a first magnetic tunnel junction (MTJ) structure comprising a first pinned magnetic layer, a first free magnetic layer and a second pinned magnetic layer, the first and second pinned magnetic layers being separated from the first free magnetic layer by at least one write-unit tunnel barrier layer, the first pinned magnetic layer being electrically coupled to a first write line through a first diode comprising an anode and cathode, the anode of the first diode being electrically connected to the first word line and the cathode of the first diode being electrically connected to the first pinned magnetic layer, the second pinned magnetic layer being electrically connected to a second word line through a second diode comprising an anode and a cathode, the anode of the second diode being electrically connected to the second pinned magnetic layer and the cathode of the second diode being electrically connected to the second word line, the first free magnetic layer being electrically coupled to a first bit line; and
   the read unit comprising a second MTJ structure comprising a third pinned magnetic layer, a second free magnetic layer and a fourth pinned magnetic layer, the third and fourth pinned magnetic layers being separated from the second free magnetic layer by at least one read-unit tunnel barrier layer, the third pinned magnetic layer being electrically coupled to a third write line through a third diode comprising an anode and cathode, the anode of the third diode being electrically connected to the third word line and the cathode of the third diode being electrically connected to the third pinned magnetic layer, the fourth pinned magnetic layer being electrically connected to a fourth word line through a fourth diode comprising an anode and a cathode, the anode of the fourth diode being electrically connected to the fourth pinned magnetic layer and the cathode of the fourth diode being electrically connected to the fourth word line, the second free magnetic layer being electrically coupled to a second bit line and being magnetically coupled to the first free magnetic layer.

18. The bidirectional memory cell according to claim 17, wherein the write unit and the read unit are radially arranged memory units,
   wherein the first pinned magnetic layer and the second pinned magnetic layer are separated from the first free magnetic layer by a single write-unit tunnel barrier layer, and
   wherein the third pinned magnetic layer and the fourth pinned magnetic layer are separated from the second free magnetic layer by a single read-unit tunnel barrier layer.

19. The bidirectional memory unit according to claim 17, wherein the write unit and the read unit are axially arranged memory units,
   wherein the first pinned magnetic layer is separated from the first free magnetic layer by a first write-unit tunnel barrier layer and the second pinned magnetic layer is separated from the first free magnetic layer by a second write-unit tunnel barrier layer, and
   wherein the third pinned magnetic layer is separated from the second free magnetic layer by a first read-unit tunnel barrier layer and the fourth pinned magnetic layer is separated from the second free magnetic layer by a second read-unit tunnel barrier layer.

20. The bidirectional memory unit according to claim 17, wherein a state of the second free magnetic layer is detected by sensing a voltage at the free magnetic layer if the third and fourth diodes are forward biased.

* * * * *